(12) United States Patent
Tsuchi

(10) Patent No.: US 7,342,527 B2
(45) Date of Patent: Mar. 11, 2008

(54) DIGITAL-TO-ANALOG CONVERTING CIRCUIT, DATA DRIVER AND DISPLAY DEVICE

(75) Inventor: Hiroshi Tsuchi, Tokyo (JP)

(73) Assignee: Nec Corporation, Tokyo (JP)

( * ) Notice: Subject to any disclaimer, the term of this patent is extended or adjusted under 35 U.S.C. 154(b) by 6 days.

(21) Appl. No.: 11/408,045

(22) Filed: Apr. 21, 2006

(65) Prior Publication Data

US 2006/0250289 A1     Nov. 9, 2006

(30) Foreign Application Priority Data

Apr. 26, 2005   (JP)   ............................. 2005-128055

(51) Int. Cl.
 *H03M 1/66*     (2006.01)
(52) U.S. Cl. ...................... 341/144; 341/145; 341/153; 341/154; 345/100
(58) Field of Classification Search ........ 341/144–145, 341/153–154
See application file for complete search history.

(56) References Cited

U.S. PATENT DOCUMENTS

| | | | |
|---|---|---|---|
| 5,396,245 A | | 3/1995 | Rempfer |
| 5,877,717 A | * | 3/1999 | Tu et al. ..................... 341/150 |
| 6,225,931 B1 | * | 5/2001 | Rao et al. .................... 341/144 |
| 6,246,351 B1 | * | 6/2001 | Yilmaz ........................ 341/145 |
| 6,326,913 B1 | * | 12/2001 | Chao et al. .................. 341/144 |
| 6,535,189 B1 | | 3/2003 | Akiyama et al. |
| 6,937,178 B1 | * | 8/2005 | Rempfer et al. ............. 341/154 |
| 6,970,122 B1 | * | 11/2005 | Yilmaz et al. ............... 341/145 |

FOREIGN PATENT DOCUMENTS

JP     2001-34234 A     2/2001

* cited by examiner

*Primary Examiner*—Khai M. Nguyen
(74) *Attorney, Agent, or Firm*—Sughrue Mion, PLLC

(57) ABSTRACT

Disclosed is a digital-to-analog converting circuit including: a reference voltage generating circuit for outputting a plurality of reference voltages having voltage values that differ from one another; a data input control circuit for exercising control based upon a control signal so as to output either one of even-numbered bits or odd-numbered bits and then the other of the even-numbered bits or odd-numbered bits from a multiple-bit digital data signal input thereto; a decoder for successively selecting first and second voltages, inclusive of voltages that are identical, from among the plurality of reference voltages, which are output from the reference voltage generating circuit, in accordance with an output signal from the data input control circuit, and outputting the selected first and second voltages successively to the single terminal; and a differential amplifier, receiving the first and second voltages output from the decoder successively from the single terminal, for outputting from an output terminal an output voltage obtained by externally dividing the first and second voltages at a predetermined prescribed external ratio.

23 Claims, 21 Drawing Sheets

FIG. 11

| LEVEL | REFERENCE VOLTAGE | V(T1) | V(T2) | B2,B1 |
|---|---|---|---|---|
| 1 |  | V2 | V3 | 0,0 |
| 2 | V2 | V2 | V2 | 0,1 |
| 3 | V3 | V3 | V3 | 1,0 |
| 4 |  | V3 | V2 | 1,1 |

FIG. 12

| LEVEL | REFERENCE VOLTAGE | V(T1) | V(T2) | B4,B3,B2,B1 |
|---|---|---|---|---|
| 1 | | V06 | V11 | 0,0,0,0 |
| 2 | | V06 | V10 | 0,0,0,1 |
| 3 | | V07 | V11 | 0,0,1,0 |
| 4 | | V07 | V10 | 0,0,1,1 |
| 5 | | V06 | V7 | 0,1,0,0 |
| 6 | V06 | V06 | V06 | 0,1,0,1 |
| 7 | V07 | V07 | V07 | 0,1,1,0 |
| 8 | | V07 | V06 | 0,1,1,1 |
| 9 | | V10 | V11 | 1,0,0,0 |
| 10 | V10 | V10 | V10 | 1,0,0,1 |
| 11 | V11 | V11 | V11 | 1,0,1,0 |
| 12 | | V11 | V10 | 1,0,1,1 |
| 13 | | V10 | V07 | 1,1,0,0 |
| 14 | | V10 | V06 | 1,1,0,1 |
| 15 | | V11 | V07 | 1,1,1,0 |
| 16 | | V11 | V06 | 1,1,1,1 |

FIG . 13

| V(T1) | V(T2) | BIT DATA (BX) ||
|---|---|---|---|
| | | 2 | 1 |
| V02 | | 0 | |
| | V02 | | 1 |
| V03 | | 1 | |
| | V03 | | 0 |

FIG. 14

| V(T1) | V(T2) | BIT DATA (BX) | | | |
|---|---|---|---|---|---|
| | | 4 | 3 | 2 | 1 |
| V06 | | 0 | | 0 | |
| | V06 | | 1 | | 1 |
| V07 | | 0 | | 1 | |
| | V07 | | 1 | | 0 |
| V10 | | 1 | | 0 | |
| | V10 | | 0 | | 1 |
| V11 | | 1 | | 1 | |
| | V11 | | 0 | | 0 |

DIGITAL-TO-ANALOG CONVERTING CIRCUIT, DATA DRIVER AND DISPLAY DEVICE

FIELD OF THE INVENTION

This invention relates to a digital-to-analog converting circuit, a data driver that employs this circuit and display device that employs the data driver.

BACKGROUND OF THE INVENTION

Liquid crystal display devices (LCDs) characterized by their thin design, light weight and low power consumption have come into widespread use in recent years and are utilized in the display units of mobile devices such as portable telephones (mobile telephones or cellular telephones), PDAs (Personal Digital Assistants) and laptop personal computers. Recently, however, liquid crystal display devices have come to be provided with large-size screens and techniques for dealing with moving pictures have become more advanced, thus making it possible to realize not only mobile applications but also stay-at-home large-screen display devices and large-screen liquid crystal televisions. Liquid crystal display devices that rely upon active matrix drive and are capable of presenting a high-definition display are being utilized as these liquid crystal displays devices. The typical structure of an active-matrix liquid crystal display device will be described with reference to FIG. 17. The principal components connected to one pixel of a liquid crystal display unit are illustrated schematically by equivalent circuits in FIG. 17.

In general, a display unit 960 of an active-matrix liquid crystal display device comprises a semiconductor substrate on which transparent pixel electrodes 964 and thin-film transistors (TFTs) 963 are laid out in the form of a matrix (e.g., 1280×3 pixel columns×1024 pixels rows in the case of a color SXGA panel); an opposing substrate on the entire surface of which a single transparent electrode 966 is formed; and a liquid crystal material sealed between these two substrates arranged to oppose each other.

The TFT 963, which has a switching function, is turned on and off under the control of a scan signal. When the TFT 963 is on, a grayscale signal voltage that corresponds to a video data signal is applied to the pixel electrode 964, and the transmittance of the liquid crystal changes according to a potential difference between each pixel electrode 964 and opposing-substrate electrode 966. This potential difference is held by capacitance 965 of the liquid crystal even after the TFT 963 is turned off, as a result of which an image is displayed.

A data line 962 that sends a plurality of level voltages (grayscale signal voltages) applied to each pixel electrode 964 and a scan line 961 that sends the scan signal are wired on the semiconductor substrate in the form of a grid (the data lines are 1280×3 in number and the scan lines are 1024 in number in the case of the above-mentioned color SXGA panel). The scan line 961 and data line 962 constitute a large capacitative load owing to the capacitance produced at the intersection of these lines and capacitance, etc., of the liquid crystal sandwiched between the opposing-substrate electrodes.

It should be noted that the scan signal is supplied to the scan line 961 by a gate driver 970, and that the supply of grayscale signal voltage to each pixel electrode 964 is performed by a data driver 980 via the data line 962. Further, the gate driver 970 and data driver 980 are controlled by a display controller 940, a required clock CLK, control signals and power-supply voltages, etc., are supplied from the display controller 940, and video data is supplied from the display controller 940 to the data driver 980. At the present time, video is principally digital data.

Rewriting of one screen of data is carried out over one frame (1/60 of a second), data is selected successively every pixel row (every line) by each scan line, and a grayscale signal voltage is supplied from each data line within the selection interval.

Although the gate driver 970 need only supply at least a binary scan signal, it is required that the data driver 980 drives the data line 962 with grayscale signal voltages of multiple levels that conform to the number of gray levels. To this end, the data driver 980 has a digital-to-analog converter (DAC) comprising a decoder for converting video data to a grayscale signal voltage and an operational amplifier for amplifying the grayscale signal voltage and outputting the amplified signal to the data line 962.

With the progress that has been made in raising image quality (increasing the number of colors) in liquid crystal display devices, there is now growing demand for at least 260,000 colors (video data of six bits per each of the colors R, G, B) and preferably 26,800,000 colors (video data of eight bits per each of the colors R, G, B) or more.

For this reason, a data driver that outputs a grayscale signal voltage corresponding to multiple-bit video data is such that the circuitry of the DAC is of larger scale. This increases the chip area of the data-driver LSI chip and invites an increase in cost. This problem will be elaborated below.

FIG. 18 is a diagram illustrating an example of the general structure of the data driver 980 shown in FIG. 17. Here the main portions of the data driver 980 are depicted as blocks. As shown in FIG. 18, the data driver 980 includes a latch address selector 981, a latch 982, a grayscale voltage generating circuit 983, decoders 984 and buffer circuits 985.

The latch address selector 981 decides data latch timing based upon a clock signal CLK. The latch 982 latches video digital data based upon the data latch timing and outputs data to each of the decoders 984 at all at once in response to an STB (strobe) signal. The grayscale voltage generating circuit 983 generates grayscale voltages the number of levels whereof corresponds to the video data. The decoders 984 each select and output one grayscale voltage that corresponds to the data input thereto, and the buffer circuits 985, to which the grayscale voltages output from the decoders 984 are applied, respectively, subject these voltages to current amplification and output the results as output voltage Vout.

By way of example, if 6-bit video data is input, the number of levels is 64 and the grayscale voltage generating circuit 983 generates grayscale voltages having 64 levels. The decoders 984 select one grayscale voltage from these grayscale voltages of 64 levels.

If 8-bit video data is input, on the other hand, then the number of levels is 256, the grayscale voltage generating circuit 983 generates grayscale voltages having 256 levels and the decoders 984 select one grayscale voltage from these grayscale voltages of 256 levels.

Thus, an increase in the number of bits of video data is accompanied by an increase in the scale of the circuitry of the grayscale voltage generating circuit 983 and decoders 984. For example, if the number of bits is increased from six to eight, the scale of the circuitry increases by four times or more. Accordingly, an increase in the number of bits of video data increases the chip area of the data driver LSI chip and raises cost.

An arrangement adapted to suppress an increase in the chip area of a data driver LSI chip even if the number of bits is increased has been proposed in Patent Document 1, described later. FIG. 19 illustrates an example of the arrangement proposed in Patent Document 1 (FIG. 19 corresponds to FIG. 4 in Patent Document 1).

As shown in FIG. 19, this data driver differs from that of FIG. 18 in terms of a grayscale voltage generating circuit 986, decoders 987 and buffer circuits 988. The grayscale voltage generating circuit 986 shown in FIG. 19 generates grayscale voltages at intervals of two levels, thereby making the number of grayscale voltage lines of the decoders 987 approximately half the number of decoders 984 in FIG. 18. The decoders 987 each select two grayscale voltages in accordance with the video data and output these grayscale voltages to the buffer circuits 988. Each buffer circuit 988 is capable of amplifying and outputting the two input grayscale voltages and grayscale voltages intermediate these two grayscale voltages.

By providing the buffer circuits 988 each of which receives two grayscale voltages and outputs one of these two grayscale voltages and a voltage intermediate these voltages, the arrangement described in Patent Document 1 seeks to halve the number of grayscale voltage lines of the decoders 987, reduce the scale of the circuitry of the decoders 987 and reduce area, i.e., lower cost. Accordingly, an increase in the chip area of the data driver LSI chip owing to an increase in the number of bits in the video data signal can be suppressed to some degree.

It should be noted that an arrangement of the kind shown in FIG. 5(B) of Patent Document 1 has been proposed as a differential amplifier that is ideal for the buffer circuit 988. In the arrangement shown in FIG. 5(B) of Patent Document 1, the output of a differential pair is the input end of a diode-connected current mirror. Although it may be thought that this is an arrangement that does not function as a differential amplifier, it can be inferred that the features of the differential amplifier proposed in Patent Document 1 are those of the differential amplifier illustrated in FIG. 20 (this is based upon the considerations of the inventor). Further, FIG. 20 is equivalent to a differential amplifier implemented using two differential pairs in FIG. 5 of Patent Document 2, described later.

As shown in FIG. 20, transistors 901 and 902 constituting a first differential pair and transistors 903 and 904 constituting a second differential pair are connected in parallel. Each differential pair is driven by a common current source 907. Grayscale voltages V(T1) and V(T2) are input to the gates of the transistors 901 and 903, respectively, the gates of the transistors 902 and 904 are coupled together and the voltage output Vout of the differential amplifier is fed back to the input. The output pair of the first and second differential pairs is connected to respective ones of the input and output ends of a current mirror (911, 912) so that an amplifying operation conforming to the output signal common to the first and second differential pairs is performed.

The differential amplifier having such a configuration is such that the following holds:

the output voltage Vout is equal to the input voltages V(T1) and V(T2) when the voltages V(T1) and V(T2) are identical; and the output voltage Vout is a voltage intermediate the voltages V(T1) and V(T2) when the voltages V(T1) and V(T2) are different.

[Patent Document 1]
Japanese Patent Kokai Publication No. JP-P2001-34234A (FIG. 4)

[Patent Document 2]
U.S. Pat. No. 5,396,245 (FIG. 5)

A first problem pointed out (see the description in section [0113] on page 13 of Patent Document 1) with regard to the differential amplifier shown in FIG. 20 is that in a case where the amplifier outputs a voltage intermediate the two input voltages V(T1) and V(T2), the voltage shifts and takes on a value offset toward either of the two input voltages if the voltage difference between the two input values becomes large.

Further, in a case where the data driver of FIG. 19 uses the differential amplifier shown in FIG. 20, the reduction in number of grayscale voltage lines of the decoders 987 that can be achieved is limited to half that of the decoders 984 in FIG. 18. A greater reduction in number of grayscale voltages cannot be attained and a reduction in area cannot be implemented.

SUMMARY OF THE DISCLOSURE

Accordingly, it is an object of the present invention to provide a digital-to-analog converting circuit that is capable of producing an output voltage with a high voltage precision even if there is a large voltage difference between the two input voltages thereto.

Another object of the present invention is to provide a small-area data driver that makes it possible to greatly reduce the number of grayscale voltage lines of decoders using the above-mentioned digital-to-analog converting circuit and to reduce by a wide margin the number of decoder elements that select grayscale voltages.

A further object of the present invention is to provide a display device that allows a reduction in cost and that makes possible a reduction in frame width in mounting of a data driver.

The above and other objects are attained by a digital-to-analog converting circuit according to one aspect of the present invention, comprising: a decoder, receiving a digital data signal and a plurality (m) of reference voltages having voltage values that differ from one another, for selecting first and second voltages, inclusive of voltages that are identical, from among the m reference voltages to output them successively to a single terminal, using the digital data signal as a selection signal; and an amplifier circuit, receiving the two voltages supplied to the single terminal from the decoder are input successively, for outputting from an output terminal a voltage obtained by externally dividing the two voltages at a predetermined prescribed external ratio; wherein a maximum of $m^2$ voltage levels that differ from one another can be output from the output terminal in accordance with the value of the digital data signal.

A digital-to-analog converting circuit according to another aspect of the present invention, comprises: a reference voltage generating circuit for outputting a plurality of reference voltages having voltage values that differ from one another; a data input control circuit for exercising control based upon a control signal so as to output either one of even-numbered bits or odd-numbered bits and then the other of the even-numbered bits or odd-numbered bits from a multiple-bit digital data signal input thereto; a decoder for successively selecting first and second voltages, inclusive of voltages that are identical, from among the plurality of reference voltages, which are output from the reference voltage generating circuit, in accordance with an output signal from the data input control circuit, and outputting the selected first and second voltages successively to a single terminal; and an amplifier circuit, receiving the first and second voltages supplied to the single terminal from the decoder successively, for outputting from an output terminal thereof an output voltage obtained by externally dividing the first and second voltages at a predetermined prescribed external ratio.

In the present invention, the data input control circuit is adapted to output either the even-numbered bits or the odd-numbered bits upon inverting these bits.

In the present invention, it may be so arranged that the even- and odd-numbered bits of the multiple-bit digital data signal are input to the data input control circuit in parallel, or it may be so arranged that either one of even-numbered bits or odd-numbered bits of the multiple-bit digital data signal are input to the data input control circuit followed by input of the other of the even-numbered bits and odd-numbered bits.

In the present invention, the decoder may include at least two switches with regard to one output signal that is output from the data input control circuit, the switches having control terminals to respective ones of which un-inverted and inverted signals of the output signal are input for turning the switches on and off; the two switches having first ends connected directly or via other switches to mutually different reference voltage supply terminals, and second ends connected directly or via other switches to the single terminal.

In the present invention, the decoder may include shared first and second switch groups each comprising a plurality of switches connected between respective ones of voltage supply terminals of the reference voltage generating circuit that outputs the plurality of reference voltages and the single terminal, wherein the switches of the first switch group are turned on and off based upon even-numbered bits from the data input control circuit, and the switches of the second switch group are turned on and off based upon odd-numbered bits from the data input control circuit.

In the present invention, the amplifier circuit may include a capacitance element and a switch, the amplifier circuit operating on the first and second voltages, which are supplied successively from the single terminal, by changing over connection of the capacitance element and switch, and outputting the resultant voltage.

In the present invention, the amplifier circuit may include a plurality of differential pairs, each having an input pair and an output pair, said plurality of differential pairs being supplied with currents from current sources associated therewith, respectively; a load circuit connected to the output pairs of said plurality of differential pairs; an amplifying stage having an input end connected to at least one connection node of a connection node pair of the load circuit and the output pairs of said plurality of differential pairs, and an output end connected to the output terminal; a switch having a first end connected to the single terminal; and a capacitor connected between a second end of said switch and a reference voltage terminal; first inputs of input pairs of said plurality of differential pairs being connected in common to the second end of said switch; and second inputs of the input pairs of a prescribed number of differential pairs among said plurality of differential pairs being connected to the single terminal, while second inputs of the input pairs of the remaining differential pairs being connected to the output terminal.

In the present invention, the amplifier circuit may include first and second differential pairs, each having an input pair and an output pair, said first and second differential pairs being supplied with currents from current sources associated therewith, respectively; a load circuit connected to the output pairs of said first and second differential pairs; an amplifying stage having an input end connected to at least one connection node of a connection node pair of the load circuit and the output pairs of said first and second of differential pairs, and an output end connected to the output terminal; a first switch having a first end connected to the single terminal; a capacitor connected between a second end of said first switch and a reference voltage terminal; first inputs of the input pairs of said first and second differential pairs being connected in common to the second end of said first switch; and second and third switches connected between a second input of the input pair of said first differential pair and the output terminal and the single terminal, respectively; a second input of the input pair of said second differential pair being connected to the output terminal.

In the present invention, the number of voltage levels that are output by the amplifier circuit is the square of the number of reference voltage levels.

In the present invention, the decoder receives as inputs first to mth ($m=2^K$, where K is a prescribed positive integer) reference voltages having voltage values that differ from one another, for selecting and outputting from the single terminal, any one pair among $4^K$ combinations of voltage pairs relating to the first to $2^K$th reference voltages; wherein a maximum of $4^K$ different voltage levels can be output from the output terminal.

In the present invention, the external ratio is 1:2 and the sum of the output voltage and the second voltage is twice the first voltage, and the decoder receives as inputs first to mth ($m=2^K$, where K is a prescribed positive integer) reference voltages having voltage values that differ from one another; wherein among first to $4^K$th linear voltage levels, first to $2^K$th reference voltages each take on a $[1+\Sigma^{K-1}x=0\ (\epsilon_x \cdot 4^x)]$th level (where $\epsilon_X$ takes on values of 1 and 2), and voltages of a total of $4^K$ levels from a first level to a $4^K$th level that differ from one another are output from the output terminal.

According to another aspect of the present invention, the foregoing object is attained by providing a data driver for driving data lines based upon a digital data signal input thereto, the data driver having the above-described digital-to-analog converting circuit.

According to another aspect of the present invention, the foregoing object is attained by providing a display device comprising: a data driver, which includes the digital-to-analog converting circuit according to the present invention set forth above; and a display panel; data lines of the display panel being driven based upon an output signal from the data driver.

According to another aspect of the present invention, the foregoing object is attained by providing a display device comprising: a plurality of data lines extending in parallel with one another along a first direction; a plurality of scan lines extending in parallel with one another in a direction perpendicular to the first direction; a plurality of pixel electrodes arranged in matrix form at intersections of the plurality of data lines and the plurality of scan lines; a plurality of transistors corresponding to respective ones of the plurality of pixel electrodes, each transistor having a drain and a source one of which is connected to the corresponding pixel electrode and the other of which is connected to a corresponding data line, and a gate connected to a corresponding scan line; a gate driver for supplying scan signals to respective ones of the plurality of scan lines; and a data driver for supplying grayscale signals, which correspond to input data, to respective ones of the plurality of data lines; the data driver comprising the data driver according to the present invention.

In the present invention, the display device may further comprise a data conversion table for making n-bit video data correspond to m-bit (n<m) video data for each of colors R, G and B; and a data converting circuit, receiving the n-bit video data signal, for converting the n-bit video data signal to the m-bit video data signal by referring to the data conversion table, and outputting the m-bit video data signal to the data driver.

The meritorious effects of the present invention are summarized as follows.

In accordance with the digital-to-analog converting circuit of the present invention, an output voltage can be output with a high voltage precision even if there is a large voltage difference between two input voltages thereto.

Further, in accordance with the present invention, the number of grayscale voltage lines of decoders can be reduced significantly over the prior art, and it is possible to provide a small-area data driver in which the number of decoder elements for selecting grayscale voltages can be reduced by a wide margin.

With a display device that employs the data driver of the present invention, it is possible to not only lower cost but also to reduce frame width in the mounting of a data driver.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 11 is a diagram illustrating input/output level correspondence when an operational amplifier circuit externally divides (extrapolates) two input voltages at a 1:2 ratio and outputs the result;

FIG. 12 is a diagram illustrating input/output level correspondence when an operational amplifier circuit externally divides (extrapolates) two input voltages at a 1:2 ratio and outputs the result;

FIG. 13 is a diagram illustrating conditions for selecting bit data when reference voltages corresponding to FIG. 11 are selected and output as V(T1) and V(T2);

FIG. 14 is a diagram illustrating conditions for selecting bit data when reference voltages corresponding to FIG. 12 are selected and output as V(T1) and V(T2);

PREFERRED EMBODIMENTS OF THE INVENTION

An embodiment of the present invention will now be described with reference to the accompanying drawings.

Figure 1:
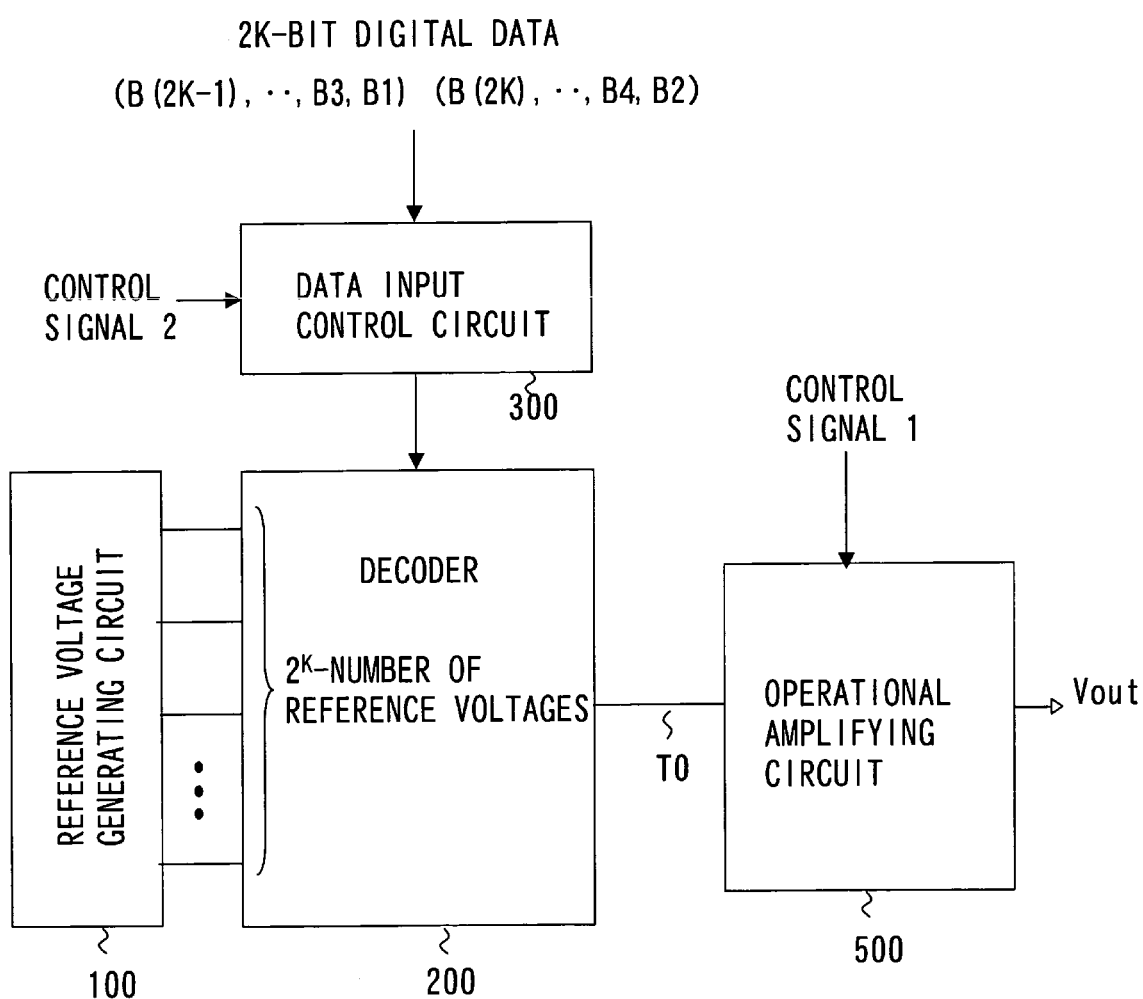
FIG. 1 is a diagram illustrating the configuration of a digital-to-analog converting circuit (DAC) according to a first embodiment of the present invention.

FIG. 1 is a diagram illustrating the configuration of a digital-to-analog converting circuit (DAC) according to a first embodiment of the present invention. As shown in FIG. 1, the DAC, which is one capable of outputting a maximum of $4^K$ voltage levels based upon 2K-bit digital data, includes a reference voltage generating circuit 100, a decoder 200, a data input control circuit 300 and a operational amplifying circuit 500.

The reference voltage generating circuit 100 generates $2^K$-number of reference voltages [V(1), V(2), ..., V($2^K$)] and supplies these reference voltages to the decoder 200. By way of example, the reference voltage generating circuit 100 comprises a resistor string across the ends of which a prescribed voltage is supplied, and voltages are extracted from taps of the resistor string. Further, the voltages from the taps may be amplified and output as by voltage-follower amplifiers.

A 2K-bit digital data signal [B(2K), B(2K-1), ..., B3, B2, B1] is supplied to the data input control circuit 300. The signal is divided into a group of even-numbered bits [B(2K), ..., B4, B2] and a group of odd-numbered bits [B(2K-1), ..., B3, B1)], and the data of one of these bit groups is inverted. In accordance with a control signal 2, the data input control circuit 300 outputs each of these bit groups serially every K bits.

From the 2 K-number of reference voltages [V(1), V(2), ..., V($2^K$)], the decoder 200 selects one every K bits, which are input at the same timing, and outputs the selected voltages serially to terminal T0.

The operational amplifying circuit 500, which has a capacitor for holding at least one of two voltages [V(T1), V(T2)] that have been output serially to the terminal T0, amplifies and outputs a voltage obtained by externally dividing (extrapolating) these two voltages at a prescribed ratio (1:2). This control operation is carried out in accordance with a control signal 1.

By using the operational amplifying circuit 500 that amplifies and outputs a voltage obtained by externally dividing (extrapolating) two serially input voltages at a prescribed ratio (1:2), the DAC according to the present invention is capable of greatly reducing the number of voltages generated by the reference voltage generating circuit 100 with respect to the number ($4^K$) of output voltage levels produced by the operational amplifying circuit 500. The number of elements of the decoder 200 that selects the voltages can be greatly reduced and so can the area of the DAC.

Reference will be had to FIGS. 11 and 12 to describe the reason why it is possible to greatly reduce the number of reference voltages generated by the reference voltage generating circuit 100. FIGS. 11 and 12 are diagrams illustrating input/output level correspondence in a case where the operational amplifier circuit 500 externally divides (extrapolates) the two input voltages V(T1) and V(T2) at a 1:2 ratio and outputs the result.

FIG. 11 is a diagram of input/output level correspondence in a case where four voltage levels are selected and output by K=1, i.e., 2-bit data (B2,B1), in FIG. 1. The number of reference voltages need be only two in this case. If these two reference voltages are set to second and third levels V2 and V3, four voltage levels can be output in linear form. Combinations of the reference voltages V2 and V3 selected as V(T1) and V(T2) by the 2-bit data (B2,B1) also are illustrated in FIG. 11. It should be noted that each voltage level in the diagram of input/output level correspondence has an assigned level number that follows the "V" symbol. For example, V2 and V3 represent voltages of levels 2 and 3, respectively. Further, the following relation holds when the output voltage Vout is a voltage obtained by externally dividing the voltages V(T1) and V(T2) at the 1:2 ratio:

$$\text{Vout} = 2 \cdot V(T1) - V(T2) \quad (1)$$

When (V2,V3), (V2,V2), (V3,V3), (V3,V2) are each selected as [V(T1), V(T2)] by the 2-bit data (B2,B1)=(0,0), (0,1), (1,0) and (1,1), as illustrated in FIG. 11, it can be confirmed from Equation (1) that Vout becomes V1, V2, V3 and V4, respectively, and that four linear voltage outputs can be obtained from two reference voltages.

FIG. 12 is a diagram of input/output level correspondence in a case where 16 voltage levels are selected and output by K=2, i.e., 4-bit data (B4, B3, B2, B1). The number of reference voltages need be only four in this case. If these four reference voltages are set to sixth, seventh, $10^{th}$ and $11^{th}$ levels V6, V7, V10 and V11, then 16 voltage levels can be output in linear form. If [V(T1), V(T2)] selected from these four reference voltages (there are instances where the selected voltages are identical) and shown in FIG. 12 are substituted into Equation (1), it can be confirmed that Vout of V1 to V16 will be obtained and that 16 linear voltage outputs can be obtained from the four reference voltages.

Thus, FIGS. 11 and 12 are obtained in case of K=1, K=2, respectively. With regard also to K=3 or greater, 4K-number of linear voltage outputs are possible with $2^K$-number of reference voltages with respect to the 2K-bit data [B(2K), B(2K-1), . . . , B3, B2, B1]. The setting of the $2^K$ reference voltages is given by Equation (2) below.

$$V_{REF1} = 1 + (\varepsilon_0 \cdot 4^0) + (\varepsilon_1 \cdot 4^1) + (\varepsilon_2 \cdot 4^2) + \cdots + (\varepsilon_{K-1} \cdot 4^{K-1}) \quad (2)$$

$$= 1 + \sum_{X=0}^{K-1} (\varepsilon_X \cdot 4^X)$$

where $\varepsilon_x$=1, 2 holds.

Figure 13:
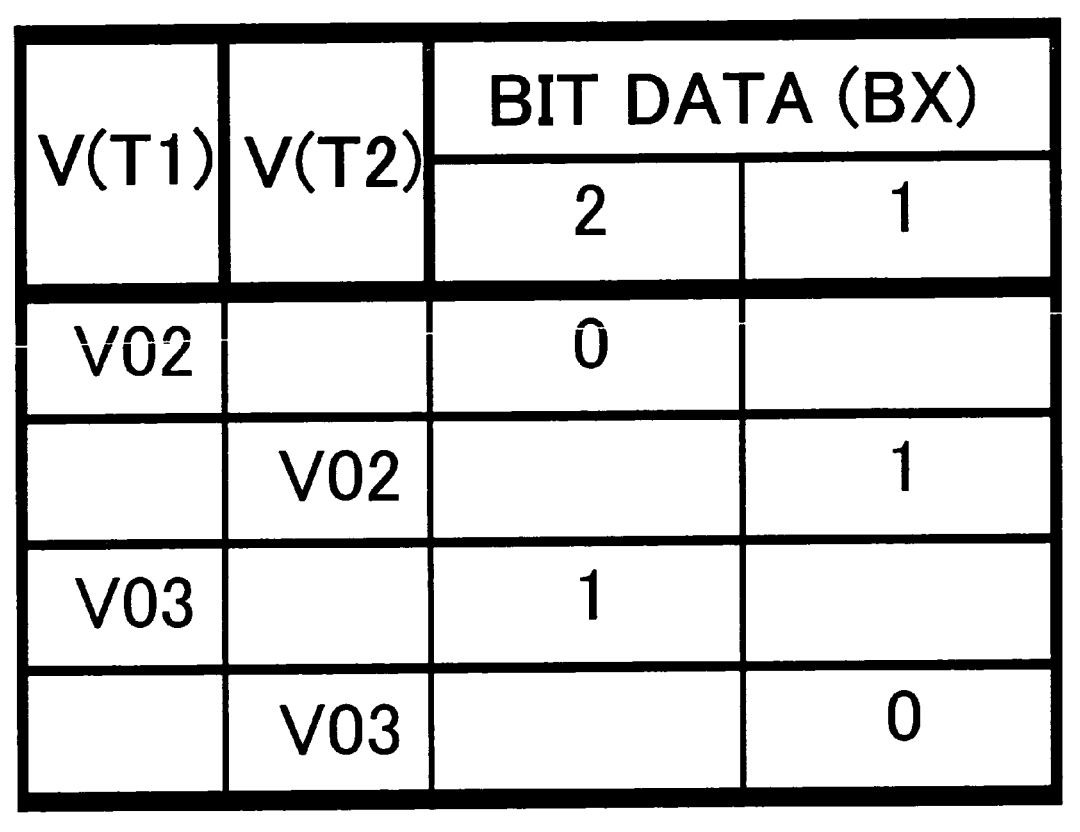

FIGS. 13 and 14 are diagrams illustrating conditions for selecting bit data when reference voltages corresponding to FIGS. 11 and 12 are selected and output as V(T1) and V(T2). As illustrated in FIGS. 13 and 14, selection of voltage V(T1) is performed based upon the even-numbered bit signal, and the selection of voltage V(T2) is performed based upon the odd-numbered bit signal. The principle of this operation will now be described.

When the digital data is 2K-bit data, 1 to $4^K$ levels of the output voltage Vout can be expressed as follows if 2K-digit binary numbers ($b_{K-1}, a_{K-1}, b_{K-2}, \ldots, b_1, a_1, b_0, a_0$) are used.

$$\text{Vout} = 1 + (a_0 \cdot 2^0) + (b_0 \cdot 1^0) + (a_1 \cdot 2^2) + (b_1 \cdot 2^3) + \cdots + \quad (3)$$

$$[a_{K-1} \cdot 2^{2(K-1)}] + [b_{K-1} \cdot 2^{2(K-1)+1}]$$

$$= 1 + \sum_{X=0}^{K-1} (a_X \cdot 2^{2X} + b_X \cdot 2^{2X+1})$$

where $a_X, b_X$ = 0, 1 holds, and $\quad (4)$ $$= 1 + \sum_{X=0}^{K-1} (a_X + 2 \cdot b_X) \cdot 4^X$$

where $a_x$, $b_x$=0, 1 holds.

It should be noted that $a_x$, $b_x$ respectively are values (0 or 1) of odd- and even-numbered digits of a 2K-digit binary number.

Further, since the 2K-digit binary number represents 0 to ($4^K$-1), 1 is added to the right side of the equation to achieve agreement with the number of levels of 1 to $4^K$ of Vout on the left side. Further, Equation (4) is quaternary notation of K digits. The relationship of ($a_x+2 \cdot b_x$) to $a_x$, $b_x$=0, 1 is the relationship shown in Table 1 below:

TABLE 1

| $b_X$ | $a_X$ | $(a_X + 2 \cdot b_X)$ |
|---|---|---|
| 0 | 0 | 0 |
| 0 | 1 | 1 |
| 1 | 0 | 2 |
| 1 | 1 | 3 |

In a case where the output voltage Vout is a voltage level obtained by externally dividing (extrapolating) the voltages V(T1) and V(T2) at the 1:2 ratio, Equation (1) holds. Further, the reference voltages V(T1) and V(T2) are defined by Equation (2). The voltages V(T1) and V(T2) are expressed as follows based upon Equation (2):

$$V(T1) = 1 + \Sigma^{K-1}_{X=0}(\beta_X \cdot 4^X) \quad (5)$$

where $\beta^X$=1, 2 holds, and $$V(T2) = 1 + \Sigma^{K-1}_{X=0}(\alpha_X \cdot 4^X) \quad (6)$$

where $\alpha^X$=1, 2 holds.

Substituting Equations (5) and (6) into Equation (1) results in the following equation:

$$\text{Vout} = 1 + \Sigma^{K-1}_{X=0}(-\alpha_X + 2 \cdot \beta_X) \cdot 4^X \quad (7)$$

where $\alpha_X$, $\beta_X$=1, 2 holds.

The Σ term in Equation (7) represents a quaternary number of K digits, and ($-\alpha_X + 2 \cdot \beta_X$) represents the value of each digit.

The relationship of ($-\alpha_X + 2 \cdot \beta_X$) to $\alpha_X$, $\beta_X$=1, 2 is the relationship shown in Table 2 below:

TABLE 2

| $\beta_X$ | $\alpha_X$ | $(-\alpha_X + 2 \cdot \beta_X)$ |
|---|---|---|
| 1 | 2 | 0 |
| 1 | 1 | 1 |
| 2 | 2 | 2 |
| 2 | 1 | 3 |

If Equation (7) and Table 2 are compared with Equation (4) and Table 1, respectively, it will be understood that they are in an equivalent relationship. In view of the foregoing, when V(T1) and V(T2) are defined by Equation (2) and the relation of Equation (1) is satisfied, Vout can take on 1 to $4^K$ voltage levels and it can be verified that the reference-voltage setting according to Equation (2) is correct.

Further, the following relations are deduced from a comparison of Tables 1 and 2:

$$\beta_X = 1 + b_X \qquad (8)$$

where $b_X = 0, 1$ holds, and $$\alpha_X = 2 - a_X \qquad (9)$$

where $a_X = 0, 1$ holds.

If we substitute Equations (8) and (9) into Equations (5) and (6), Equations (10) and (11) below are derived.

$$V(T1) = 1 + \Sigma^{K-1}_{X=0}(1+b_X) \cdot 4^X \qquad (10)$$

where $b_X = 0, 1$ holds, and $$V(T2) = 1 + \Sigma^{K-1}_{x=0}(2-a_X) 4^X \qquad (11)$$

where $a_X = 0, 1$ holds

In accordance with Equations (10) and (11), the levels of V(T1) are defined by each of the values ($b_X$) of even-numbered digits in binary representation of Vout, and the levels of V(T2) are defined by each of the values ($a_X$) of odd-numbered digits in binary representation of Vout.

Accordingly, it is indicated that in a case where the output voltage Vout is a voltage level obtained by externally dividing the voltages V(T1) and V(T2) at a 1:2 ratio, the selection of voltages V(T1) and V(T2) is performed based upon even- and odd-numbered bit signals, respectively.

This can also be confirmed from FIGS. 13 and 14. For example, FIGS. 14 is a diagram of input/output level correspondence of 4-bit data (B4,B3,B2,B1) in FIG. 12 and illustrates selection conditions for which reference voltages V6, V7, V10 and V11 are selected as V(T1) and V(T2). The selection of voltage V(T1) is stipulated by the even-numbered bits (B4,B2), and the selection of voltage V(T2) is stipulated by the odd-numbered bits (B3,B1)

The relationship between the binary representation of Vout and the reference voltages V(T1) and V(T2) will now be described. Equation (10) relating to V(T1) is transformed to the following binary representation:

$$V(T1) = 1 + \Sigma^{K-1}_{x=0}(1+b_X) \cdot 2^2 \qquad (12)$$

where $b_X = 0, 1$.

From a comparison of Equations (3) and (12), $(1+b_X)$ is related to the value of an odd-numbered digit of a binary number of 2K bits, (1+$b_X$)=1 if $b_X$=0 holds, and
(1+$b_X$)=2 if $b_X$=1 holds.

When (1+$b_X$)=2 holds, however, a carry is generated.

Accordingly, if the output levels of the output voltage Vout are associated by binary numbers, an even-numbered digit is expressed by $b_X$ and the odd-numbered digit that is one digit lower is expressed by $a_X$, then it is deduced that the voltage level for which the two digits identical with ($b_X, a_X$) are made (0,1) when $b_X$=0 holds is V(T1); and it is deduced that the voltage level for which the two digits identical with ($b_X, a_X$) are made (1,0) when $b_X$=1 holds is V(T1).

Further, Equation (11) relating to V(T2) is similarly transformed to the following binary representation:

$$V(T2) = 1 + \Sigma^{K-1}_{x=0}(2-a_X) \cdot 2^2 \qquad (13)$$

where $a_X = 0, 1$.

From a comparison of Equations (3) and (13), $(2-a_X)$ is related to the value of an odd-numbered digit of a binary number of 2K bits, and we can write the following:

(2-$a_X$)=2 when $a_X$=0 holds, and
(2-$a_X$)=1 when $a_X$=1 holds.

When (2-$a_X$)=2 holds, however, a carry is generated.

Accordingly, if the output levels of the output voltage Vout are associated by binary numbers, an even-numbered digit is expressed by $b_X$ and the odd-numbered digit that is one digit lower is expressed by $a_X$, then it is deduced that the voltage level for which the two digits identical with ($b_X, a_X$) are made (1,0) when $a_X$=0 holds is V(T2); and it is deduced that the voltage level for which the two digits identical with ($b_X, a_X$) are made (0,1) when $a_X$=1 holds is V(T2).

For example, if Vout corresponding to the 4-bit data (B4,B3,B2,B1) is (0,1,0,0), then we have the following:

V(T1) is (0,1,0,1) based upon the values of B4 and B2 of the even-numbered digits; and V(T2) is (0,1,1,0) based upon the values of B3 and B1 of the odd-numbered digits. This is in agreement with the relationship shown in FIG. 13.

Further, the condition for the case where reference voltages for which V(T1) and V(T2) are identical are selected is as follows from Equation (1):

$$V(T1) = V(T2) = Vout$$

and $$(1+b_X) = (2-a_X)$$

is deduced from Equations (12), (13), where $a_X$, $b_X$=0, 1 holds. The condition for ($b_X, a_X$) that satisfies this is as follows:

$$(b_X, a_X) = (0,1), (1,0)$$

Accordingly, if reference voltages for which V(T1) and V(T2) are identical are selected, a complementary (inverted) relationship will exist between each value ($b_X$) of the even-numbered digits in binary representation stipulating V(T1) and each value ($a_X$) of odd-numbered digits stipulating V(T2).

For example, in FIG. 14, even-numbered bit data (B4,B2) and odd-numbered bit data (B3,B1) that select reference voltage V06 for output to V(T1) and V(T2) are in a complementary (inverted) relationship of (0,0) and (1,1). The same is true with regard to other reference voltages as well.

It should be noted that the DAC of FIG. 1 utilizes this characteristic and inputs the data of either the even-numbered bit group or odd-numbered bit group to the decoder 200 upon inverting the data in the data input control circuit 300. As a result, the decoder 200 can be implemented as a common decoder shared by the even-numbered bit group and odd-numbered bit group and selects one reference voltage from the 2K-number of reference voltages based upon K-bit digital data. A decoder of such structure can readily be implemented by a well-known decoder architecture.

Accordingly, while the input to the DAC of FIG. 1 is 2K-bit digital data, the arrangement is such that the input to the decoder 200 is K-bit data. This makes it possible to greatly reduce the number of elements constructing the decoder 200 and to reduce the area of the DAC.

Figure 2:
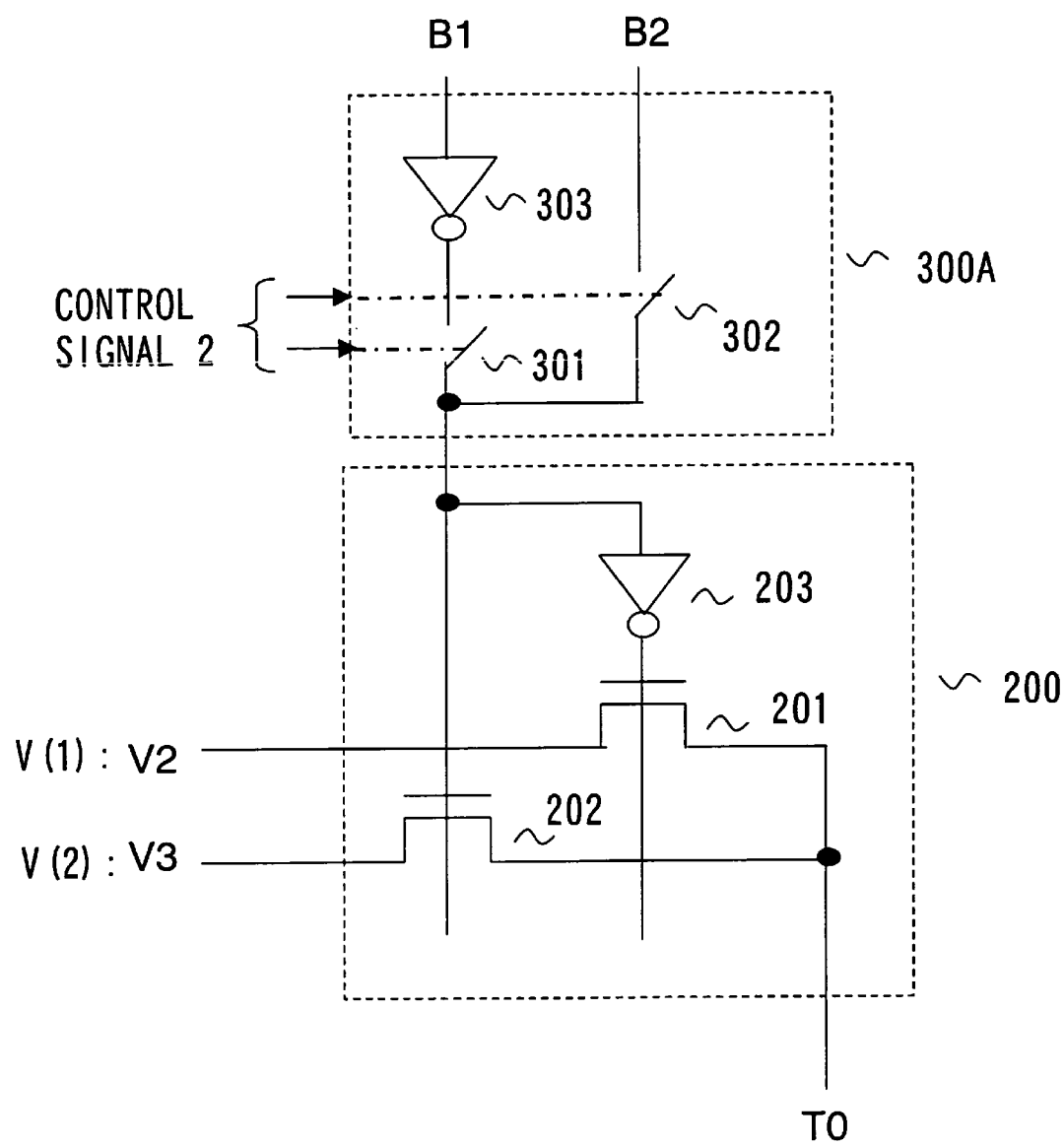
FIG. 2 is a diagram illustrating the configuration of a data input control circuit and decoder [2-bit data input (K=1)] according to an embodiment of the present invention.
Figure 3:
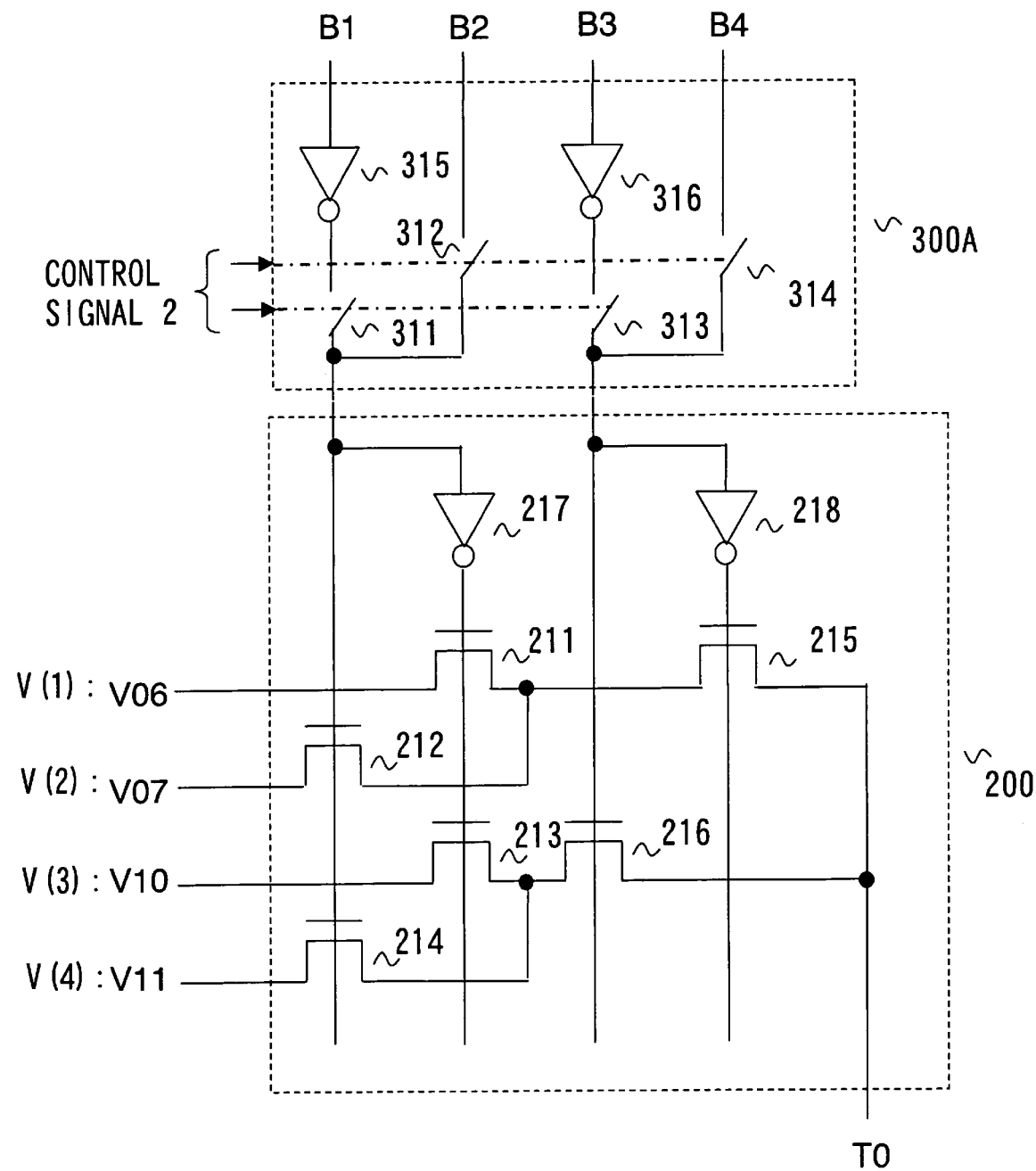
FIG. 3 is a diagram illustrating the configuration of a data input control circuit and decoder [4-bit data input (K=2)] according to an embodiment of the present invention.
Figure 4:
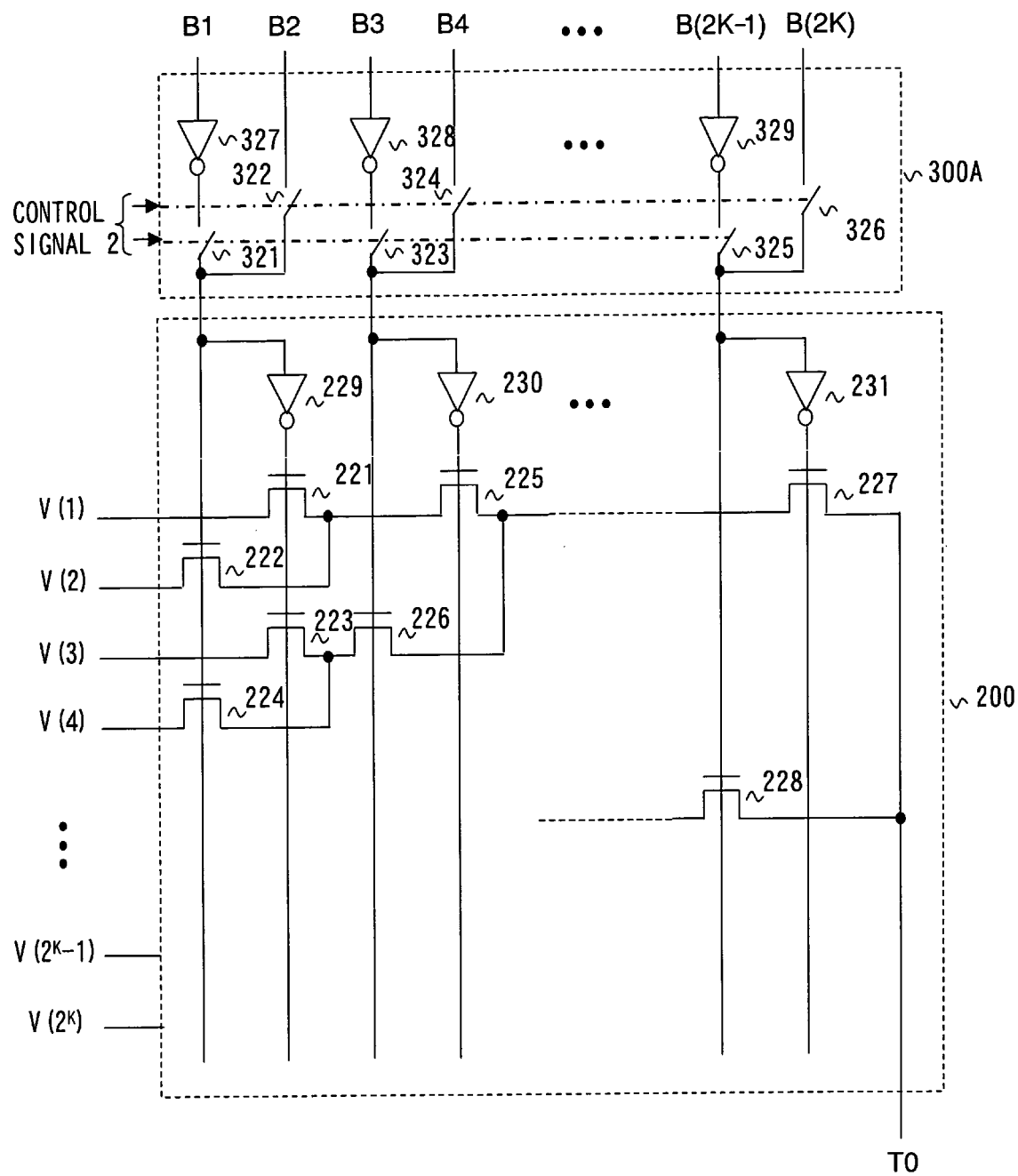
FIG. 4 is a diagram illustrating the configuration of a data input control circuit and decoder (2K-bit data input) according to an embodiment of the present invention.

FIGS. 2, 3 and 4 are diagrams illustrating structures of the data input control circuit 300 and decoder 200, which comprises n-channel transistors, in the DAC of FIG. 1. FIGS. 2 and 3 are for a 2-bit data input (K=1) and 4-bit data input (K=2), respectively, and FIG. 4 is generalized for a 2K-bit data input. The arrangement is such that 2K-bit digital data is input in parallel to each of the data input control circuits of FIGS. 2, 3 and 4. Here the data input control circuit is designated at 300A. As shown in FIG. 2, the data input control circuit 300A is such that bit data B1 is connected to the output of data input control circuit 300A via an inverter 303 and switch 301, and bit data B2 is connected to the output of the data input control circuit 300 via a switch 302. The switches 301 and 302 are turned ON and OFF by the control signal 2 and control is such that after an output signal corresponding to one of bit data B1 and B2 is output, an output signal corresponding to the other of the bit data is output. The decoder 200 includes a transistor 201 connected between reference voltage supply terminal V(1) and terminal T0, and a transistor 202 connected between reference voltage supply terminal V(2) and terminal T0. The output of the data input control circuit 300 is supplied to the gate of transistor 202 and is also supplied to the gate of transistor 201 upon being inverted by an inverter 203.

As shown in FIG. 3, the data input control circuit 300A is such that bit data B1 is connected to a first output of data input control circuit 300A via an inverter 315 and switch 311, bit data B2 is connected to the first output of data input control circuit 300A via a switch 312, bit data B3 is connected to a second output of the data input control circuit 300A via an inverter 316 and switch 313, and bit data B4 is connected to the second output via a switch 314. The switches 311, 312, 313 and 314 are turned ON and OFF by the control signal 2 and control is such that after an output signal corresponding to one of even-numbered bits (B2,B4) and odd-numbered bits (B1,B3) is output, an output signal corresponding to the other of these is output.

The decoder 200 includes transistors 211 and 212 having first terminals (one of either the source or drain) connected to the reference voltage supply terminals V(1) and V(2), respectively, and having second terminals (the other of either the source or drain) tied together; transistors 213 and 214 having first terminals connected to the reference voltage supply terminals V(3) and V(4), respectively, and having second terminals tied together; a transistor 215 having a first terminal connected to the common connection node of the second terminals of transistors 211 and 212 and a second terminal connected to the terminal T0; and a transistor 216 having a first terminal connected to the common connection node of the second terminals of transistors 213 and 214 and a second terminal connected to the terminal T0. The first output of the data input control circuit 300A is supplied to the gates of the transistors 212 and 214; a signal that is a result of inverting the first output of the data input control circuit 300A by the inverter 217 is supplied to the gates of the transistors 211 and 213; the second output of the data input control circuit 300A is supplied to the gate of the transistor 216; and a signal that is a result of inverting the second output of the data input control circuit 300A by the inverter 218 is supplied to the gate of the transistor 215.

Referring to FIG. 4, the data input control circuit 300A is such that input data bits are formed into pairs every two bits of bit data B(2L-1) and B(2L) (where L represents a positive integer of 1 to K), and the circuit has one output terminal for each pair. Input terminals of odd-numbered bit data B(2L-1) are connected to output terminals via respective ones of inverters and switches, and input terminals of even-numbered bit data B(2L) are connected to output terminals via respective ones of switches.

For every even-numbered bit and every odd-numbered bit, each switch is turned ON and OFF by the control signal 2, and control is such that after an output signal corresponding to one of even-numbered bits and odd-numbered bits is output, an output signal corresponding to the other of these is output. That is, the data input control circuit 300A is capable of producing a serial output in units of K-bit digital data.

The decoder 200 can be any decoder for selecting and outputting, to terminal T0, one reference voltage from 2K-number of reference voltages [V(1), V(2), ..., V($2^K$)] based upon K-bit digital data. A tournament-type decoder is illustrated in FIGS. 2, 3 and 4. The $2^K$-number of reference voltages can be set based upon Equation (2) cited above.

If we let V(T1) represent the voltage selected and output to terminal T0 based upon the data of the even-numbered bit group and let V(T2) represent the voltage selected and output to terminal T0 based upon the data of the odd-numbered bit group, then the arrangements of FIGS. 2 and 3 will satisfy the relationships shown in FIGS. 11 and 12.

Figure 5:
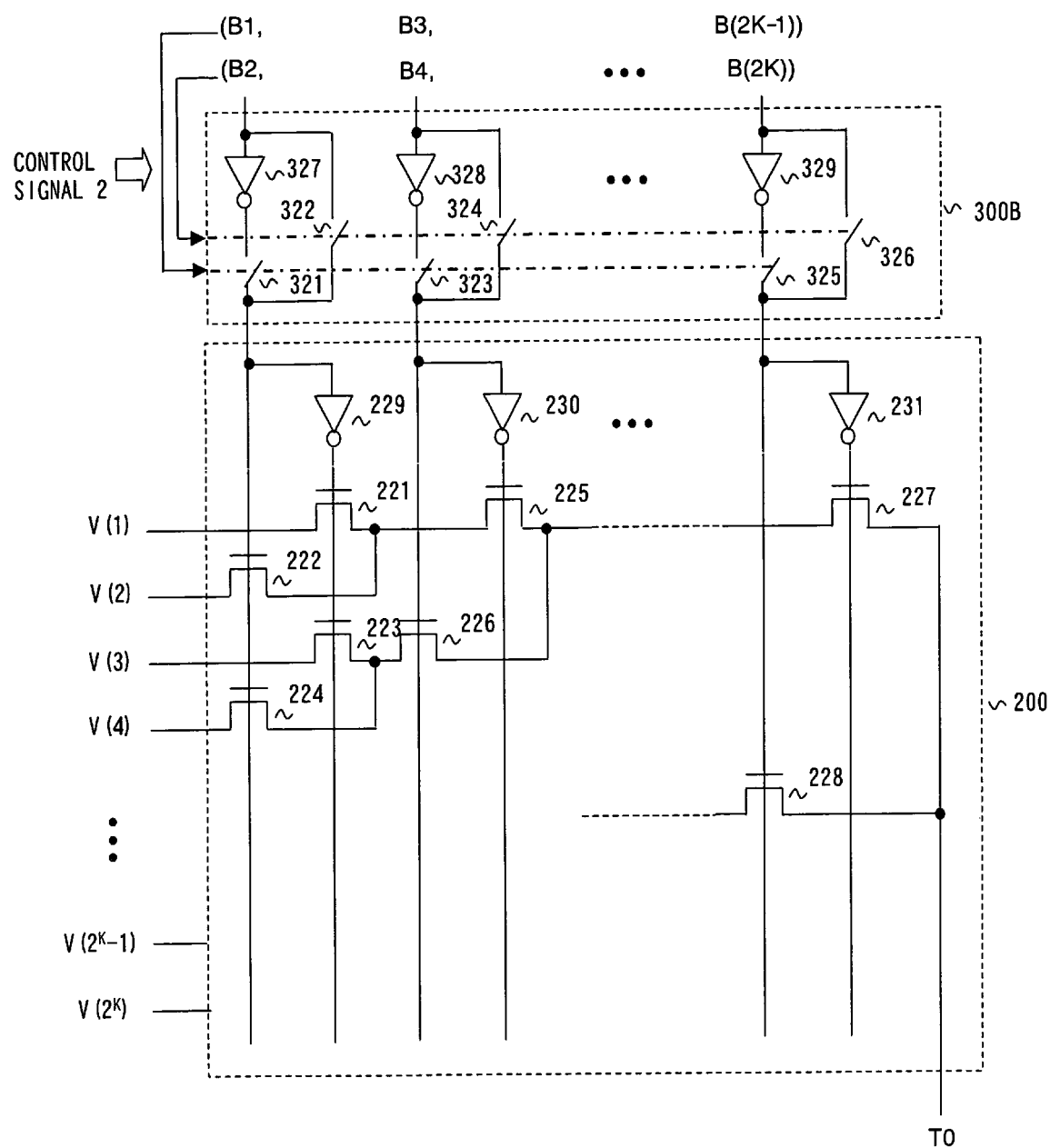
FIG. 5 is a diagram illustrating a modification of FIG. 4.

FIG. 5 is a diagram illustrating a modification of FIG. 4. Here the data input control circuit, which is indicated at 300B, differs from that of FIG. 4. The data input control circuit 300B shown in FIG. 5 is such that 2K-bit digital data is input serially for every even-number bit group and odd-numbered bit group. The data input control circuit 300B is such that input data bits are formed into pairs every two bits of bit data B(2L-1) and B(2L) (where L represents a positive integer of 1 to K), and the circuit has one input terminal and one output terminal for each pair. The input terminal and output terminal of each pair are connected in parallel with a path in which an inverter and switch are serially connected and a path in which only a switch is connected. For every even-numbered bit and every odd-numbered bit, each switch is controlled by the control signal 2, and a serial output is produced in units of K-bit digital data. The control signal 2 controls the serial input of the even-numbered and odd-numbered bit groups of 2K-bit digital data to the data input control circuit 300B simultaneously, and the data of the odd-numbered bit group in FIG. 5 is inverted by inverters. The decoder 200 has a structure identical with that shown in FIG. 4.

In the implementations illustrated in FIGS. 2, 3, 4 and 5, let V(T1) represent the voltage selectively output to the terminal T0 based upon the even-numbered bit group, and let V(T2) represent the voltage selectively output to the terminal T0 based upon the odd-numbered bit group. It should be noted that although FIGS. 2, 3, 4 and 5 illustrate arrangements in which the data of the odd-numbered bit group is inverted by inverters in both the data input control circuit 300A and 300B, it is also possible to adopt an arrangement in which the data of the even-numbered bit group is inverted. In such case the inverters would be re-assigned to the data of the even-numbered bit group. However, the output signals of the data input control circuit in such case would be signals obtained by inverting the same output signals in FIGS. 2, 3, 4 and 5. Accordingly, it is required that the decoder 200 also be adapted to invert the signals that are input to the gates of each of the n-channel transistors. Alternatively, the n-channel transistors of the decoder 200 may be replaced by p-channel transistors without inverting the signals input to the gates thereof.

Figure 6A:
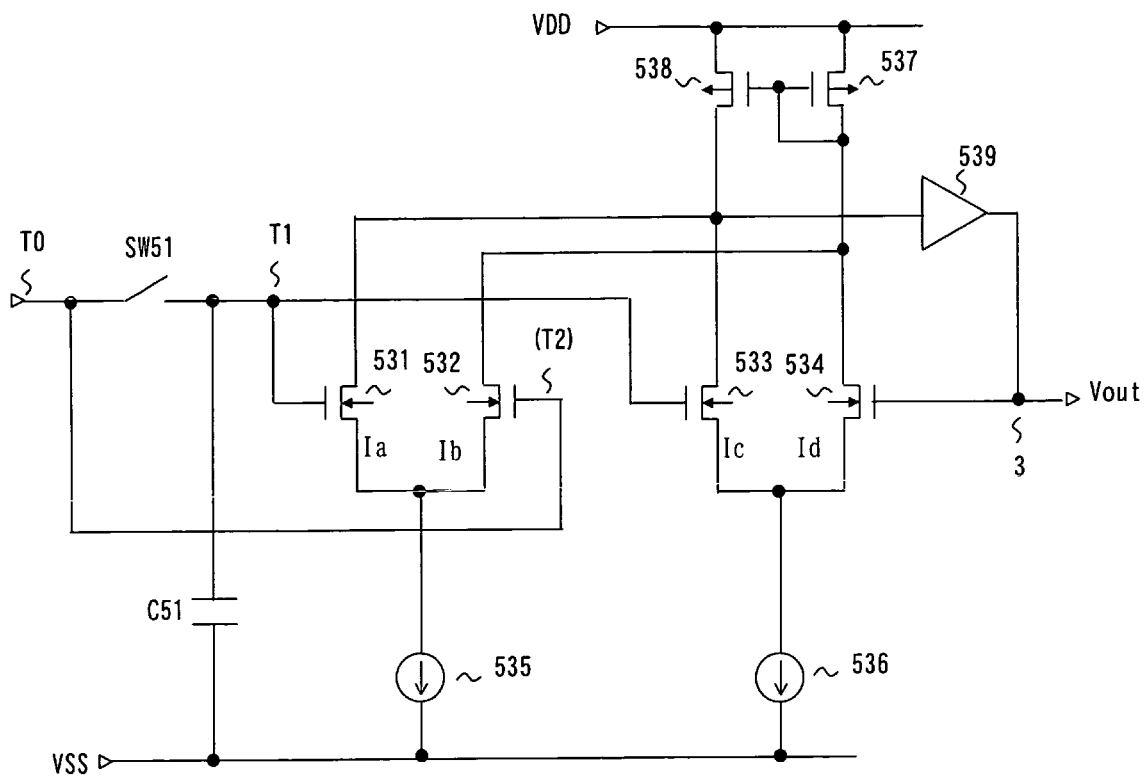
FIGS. 6A and 6B are diagrams illustrating the configuration of an operational amplifier circuit 500, which is included in the DAC of FIG. 1, for outputting a voltage obtained by externally dividing (extrapolating), at a 1:2 ratio, two voltages selectively output in a time serial.
Figure 6B:
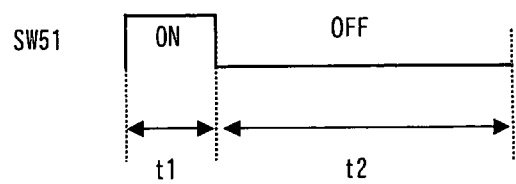

FIGS. 6A and 6B illustrate an example of the structure of the operational amplifier circuit 500, which is included in the DAC of FIG. 1, for outputting a voltage obtained by externally dividing (extrapolating), at a 1:2 ratio, two voltages selectively supplied to terminal T0 in a time serial.

Before describing FIGS. 6A and 6B, FIG. 15 serving as the basis of the circuit arrangement of FIG. 6A will be described. FIG. 6A is the result of changing input terminals T1 and T2 in FIG. 15 to an input terminal T0. The arrangement shown in FIG. 15 is an operational amplifier circuit for amplifying and outputting a voltage obtained by externally dividing (extrapolating) the voltages V(T1) and V(T2) of terminals T1 and T2, respectively, at a 1:2 ratio.

Figure 15:
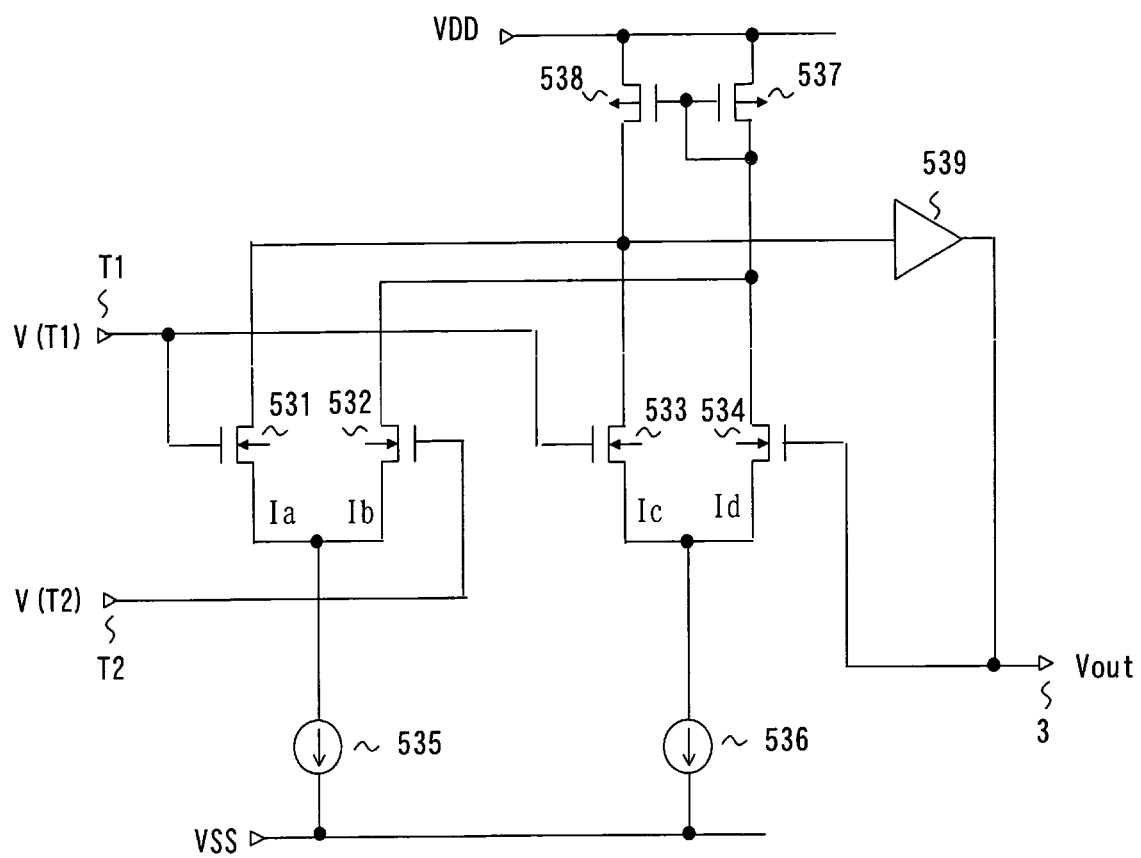
FIG. 15 is a diagram illustrating the configuration of an operational amplifier circuit for amplifying and outputting a voltage obtained by externally dividing (extrapolating) voltages V(T1) and V(T2) at a 1:2 ratio.

As shown in FIG. 15, this operational amplifier circuit has two differential pairs in which one member of each of the input pairs is connected to terminal T1 and the other is connected to terminal T2 and the output terminal. More specifically, the arrangement includes two differential pairs (a differential pair comprising a transistor pair (531, 532) and a current-source transistor 535, and a differential pair comprising a transistor pair (533, 534) and a current-source transistor 536) in which the output pairs are connected in common to a current mirror (comprising a transistor pair (537, 538)) that constitutes a load circuit. The gates of transistors 531 and 532 that form the non-inverting input terminal and inverting input terminal of differential pair (531, 532) are connected to the terminals T1 and T2, respectively, and the gates of transistors 533 and 534 that form the non-inverting input and inverting input of differential pair (533, 534) are connected to the terminal T1 and output terminal 3, respectively. The voltage at the output end (the connection node at which the transistors 531, 533, and 538 are connected) of the current mirror (537, 538) is supplied to an amplifier 539 whose output end is connected to the output terminal 3.

In a case where the transistors of the two differential transistor pairs in FIG. 15 are transistors of the same size and the current sources (transistors 535 and 536) that drive respective ones of the differential pairs are also set to be equal, a voltage obtained by extrapolating the voltages V(T1) and V(T2) can be output as the output voltage Vout.

Figure 16:
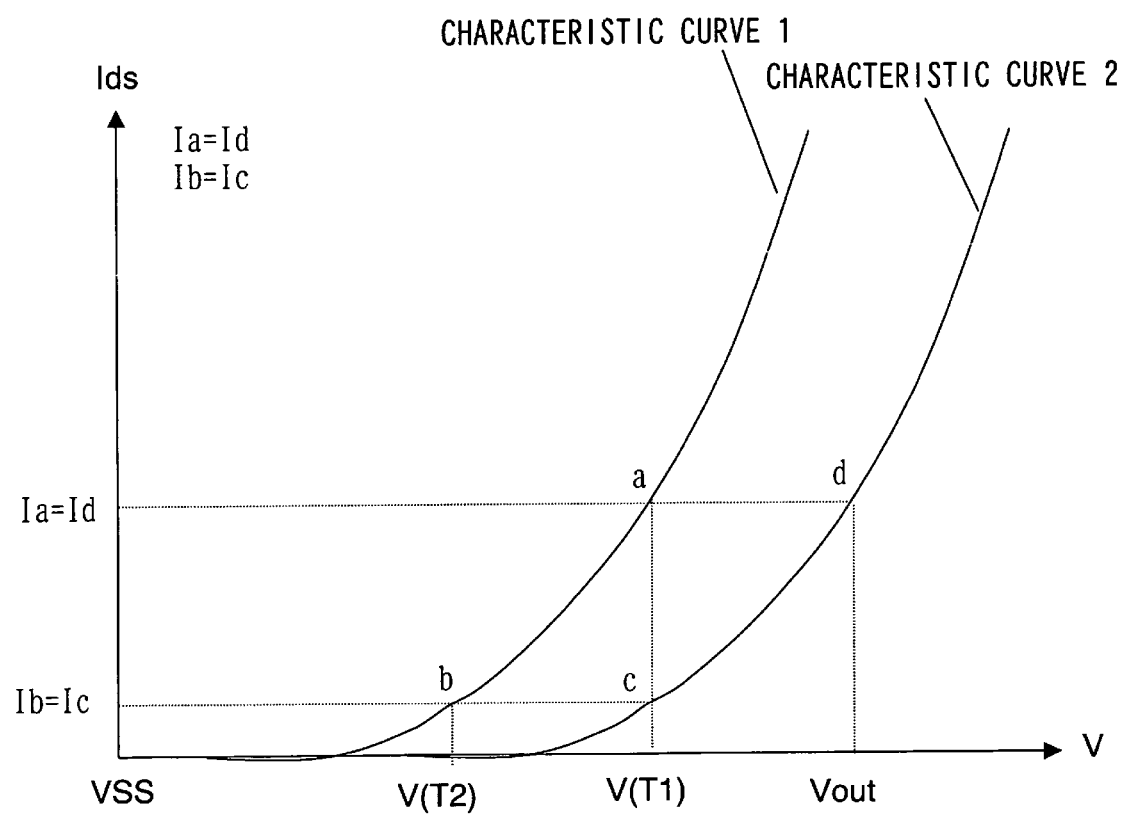
FIG. 16 is a diagram for describing operation in case of V(T1)>V(T2)

Reference will be had to FIG. 16 to describe the principle whereby the arrangement of FIG. 15 externally divides (extrapolates) the voltages V(T1) and V(T2) at respective terminals T1 and T2 at a 1:2 ratio. FIG. 16, which is a diagram useful in describing operation in a case where V(T1)>V(T2) holds, illustrates the relationship between a drain-source current Ids and gate voltage V. A characteristic curve 1 of the transistors 531 and 532 and a characteristic curve 2 of the transistors 533 and 534 are indicated. The operating points of the respective transistors reside on respective ones of the characteristic curves. It should be noted that the two characteristic curves are merely displaced from each other along the horizontal axis owing to the fact that the source potentials of respective ones of the two differential pairs vary individually.

If we let Ia, Ib, Ic and Id represent the currents (drain-to-source currents) that correspond to operating points a, b, c, and d of the transistors 531, 532, 533 and 534, respectively, Equations (14) and (15) below hold as the relationships among the currents of the transistors in FIG. 16.

$$Ia+Ib=Ic+Id \quad (14)$$

$$Ia+Ic=Ib+Id \quad (15)$$

Equation (14) is an equation derived owing to the fact that the currents that flow into the current sources 535 and 536 are equal, and Equation (15) is an equation derived owing to the fact that the input/output currents of the current mirrors (537, 538) are equal.

If the relations cited above are solved, Equation (16) below is derived.

$$Ia=Id, Ib=Ic \quad (16)$$

In view of Equation (16), the four operating points a, b, c and d are decided as indicated in FIG. 16. The operating points a and c of transistors 531 and 533 are such that V=V(T1) is common with respect to the horizontal axis V in FIG. 16. Accordingly, the figure connecting the four operating points is a parallelogram and sides ad and bc are equal. The output voltage Vout, therefore, becomes a voltage obtained by externally dividing (extrapolating) the voltages V(T1) and V(T2) at a ratio of 1:2. It should be noted that although FIG. 16 is a diagram illustrating operation in a case where V(T1)>=V(T2) holds, the output voltage Vout becomes a voltage obtained by externally dividing (extrapolating) the voltages V(T1) and V(T2) at a ratio of 1:2 similarly also in a case where V(T1)=<V(T2) holds.

The operation (operating principle) shown in FIG. 16 holds even if the voltage difference between the two voltages V(T1) and V(T2) is large. Accordingly, the operational amplifier circuit of FIG. 15 is an amplifier circuit capable of a highly accurate output.

FIG. 6A is an arrangement that is a modification of FIG. 15. FIG. 6A illustrates an arrangement in which the terminal T2 of FIG. 15 is connected to the terminal T0 and there are additionally provided a switch SW51 connected between terminals T0, T1 and a capacitor C51 connected between the terminal T1 and reference voltage VSS. This arrangement is similar to that of FIG. 15 in other respects.

FIG. 6B is a timing chart of ON/OFF control of the switches SW51 over one data interval (t1 to t2). As shown in FIG. 6B, switch SW51 is turned ON in time period t1. At this time the voltage that has been input to terminal T0 is supplied to terminal T1 as well. If this voltage is assumed to be V(T1), then, in time period t1, the voltage V(T1) is supplied to both ends of the input pair of the differential pair (531, 532) and to the non-inverting input terminal (the gate of transistor 533) of the differential pair (533, 534), and an electric charge that holds the terminal T1 at the voltage V(T1) is accumulated in the capacitor C51. At this time the arrangement of FIG. 6A becomes a voltage follower and the output voltage Vout becomes the voltage V(T1).

Next, in time period t2, switch SW51 is turned OFF. The voltage that has been input at this time, is supplied to terminal T0. If this voltage is assumed to be V(T2), then, in time period t2, the voltage V(T2) is supplied to an inverting input terminal (the gate of transistors 532) of the differential pair (531, 532).

On the other hand, even after switch SW51 has been turned OFF, the terminal T1 is held at the voltage V(T1) by the electric charge held in the capacitor C51. This state is similar to that of FIG. 15 and therefore the output voltage Vout becomes a voltage obtained by externally dividing (extrapolating) the voltages V(T1) and V(T2) at a 1:2 ratio.

More specifically, the arrangement of FIG. 6A is an operational amplifier circuit that is the result of changing to an arrangement in which the input voltages V(T1) and V(T2) of FIG. 15 are input serially in successive fashion. It should be noted that FIG. 6A illustrates an example in which the voltages V(T1) and V(T2) are input serially to the terminal T0 in sequential fashion in the time periods t1, t2. However, in a case where the order of input of the voltages V(T1) and V(T2) is interchanged, it will suffice to modify the arrangement in such a manner that the switch SW51 and capacitor C51 of FIG. 6A are connected between the terminal T0 and the terminal T2 (the gate of transistor 532) and the terminal T1 is connected directly to terminal T0.

Figure 7A:
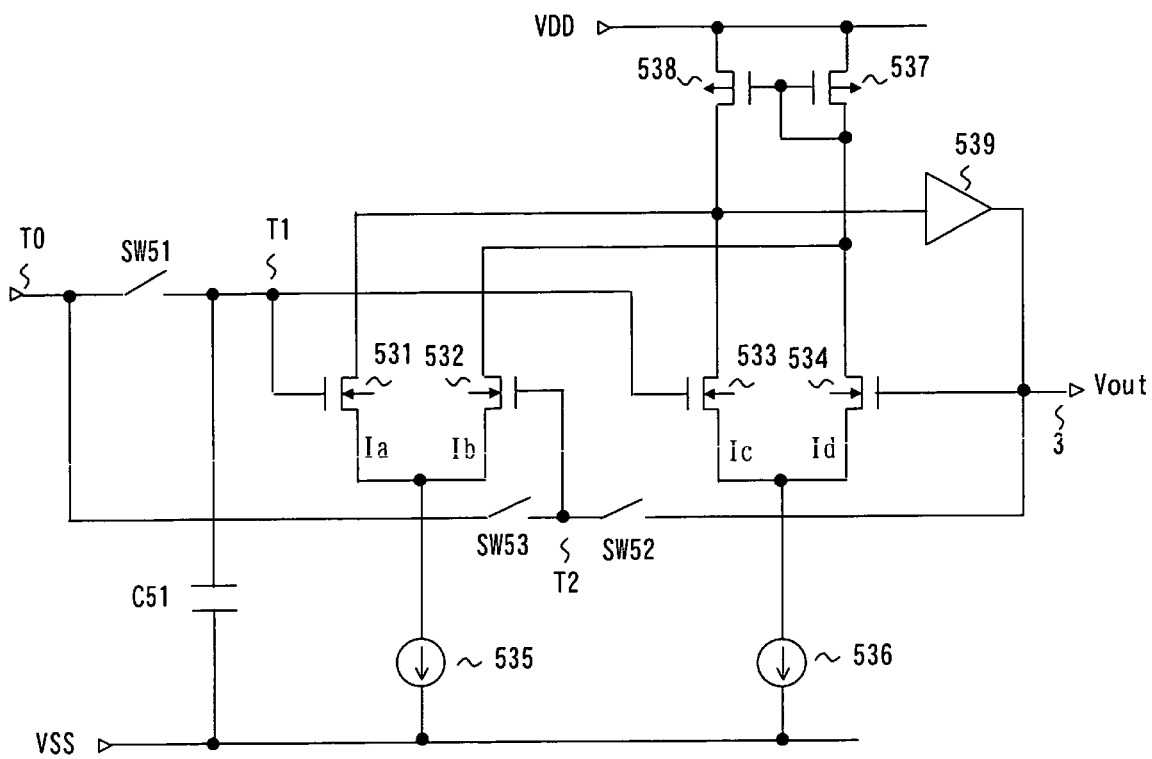
FIG. 7A and 7B are diagrams illustrating a modification of FIGS. 6A and 6B.
Figure 7B:
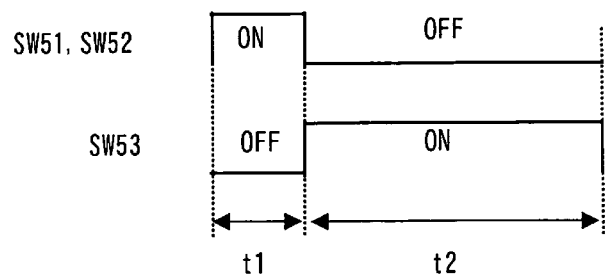

FIGS. 7A and 7B are diagrams illustrating a modification of FIGS. 6A and 6B. In the example shown in FIGS. 7A and 7B, the circuit includes a switch SW53 connected between the gate of transistor 532 and terminal T0 and a switch SW52 connected between the gate of transistor 532 and output terminal 3. Switches SW51 and SW52 are turned ON in time period t1 and are turned OFF in time period t2. Switch SW53 is turned OFF in time period t1 and is turned ON in time period t2.

The operational amplifier circuit shown in FIG. 6A is such that in time period t1, the differential pair (533, 534) operates as a voltage follower but the differential pair (531, 532) does not.

On the other hand, the arrangement shown in FIG. 7A is such that the two differential pairs (531, 532) and (533, 534) both operate as voltage followers in time period t1. As a result, driving performance in time period t1 for outputting voltage V(T1) is enhanced.

Figure 8A:
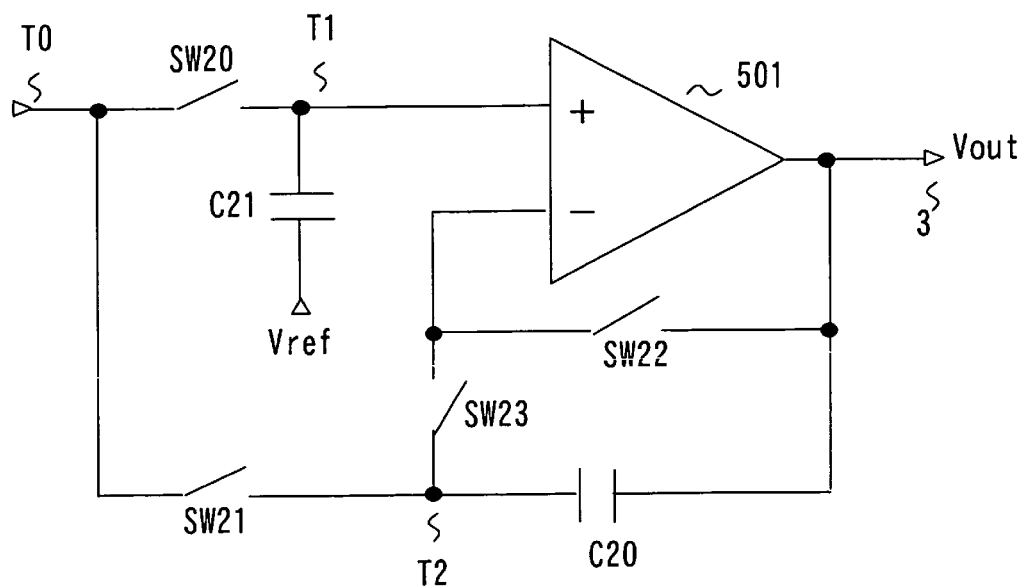
FIG. 8A is a diagram illustrating a modification of the operational amplifier circuit of FIG. 6A.

FIG. 8A is a further example of the structure of the operational amplifier circuit 500, which is included in the DAC of FIG. 1, for outputting a voltage obtained by externally dividing (extrapolating), at a 1:2 ratio, two voltages selectively supplied to terminal T0 in a time serial. The operational amplifier circuit of FIG. 8A has a capacitor and a differential amplifier and means for exercising control in such a manner that a difference voltage between two serially input voltages is applied as voltage across the terminals of the capacitor, and such that the voltage across the terminals of the capacitor is added to or subtracted from one of these voltages, whereby there is output a voltage that is the result of externally dividing these two voltages.

Figure 8B:
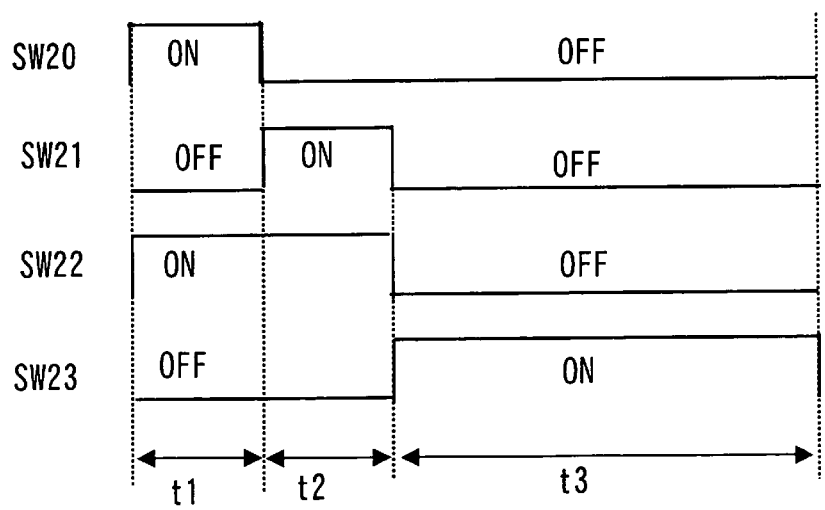
FIG. 8B is a diagram illustrating ON/OFF control of first to fourth switches.

FIG. 8A is a diagram illustrating an example of the structure of the operational amplifier circuit. FIG. 8B illustrates the ON/OFF control state in one output interval of the first to fourth switches SW20, SW21, SW22 and SW23.

The circuit of FIG. 8A includes a differential amplifier 501, such as an operational amplifier, having a non-inverting input terminal (+) connected to terminal T1; a capacitor C20 connected between output terminal 3 of the differential amplifier 501 and terminal T2; a capacitor C21 having one end connected to terminal T1 and the other connected to the supply terminal of reference voltage Vref; switches SW20 and SW21 connected between terminal T0 and terminals T1 and T2, respectively; a switch SW22 having one end connected to the inverting input terminal (−) of differential amplifier 501 and the other end connected to output terminal 3; and a switch SW23 having one end connected to the inverting input terminal of differential amplifier 501 and the other end connected to terminal T2.

FIG. 8B is a timing chart of ON/OFF control of the switches SW20, SW21, SW22 and SW23 over one data interval (t1 to t3). In time period t1 in FIG. 8B, switches SW20 and SW22 are turned ON and switches SW21 and SW23 are turned OFF. At this time the differential amplifier 501 becomes a voltage follower and the voltage that has been input to terminal T0 is supplied to terminal T1. If this voltage is V(T1), then, in time period t1, the voltage V(T1) is held at terminal T1 by capacitor C21 and the node of capacitor C20 and output terminal 3 also is held at voltage V(T1) amplified and output by the differential amplifier 501.

Next, in time period t2, switches SW20 and SW23 are turned OFF and switches SW21 and SW22 are turned ON, whereupon the voltage that has been input to terminal T0 is supplied to terminal T2. If this voltage is V(T2), then, in time period t2, the voltage V(T1) continues being held at terminal T1 and output terminal 3. As a result, the voltages V(T1) and V(T2) are impressed on both ends of the capacitor C20 and this voltage difference is held.

If switches SW20, SW21 and SW22 are turned OFF and switch SW23 is turned ON in time period t3, the capacitor C20 is connected between the inverting input terminal (−) and output terminal 3 and the voltage difference between voltage V(T1) and V(T2) held in time period t2 is applied across both terminals. Further, the voltage V(T1) continues being held at terminal T1, which is the non-inverting input terminal (+) of the differential amplifier 501. Accordingly, the output voltage Vout becomes a voltage that is the result of adding the voltage difference [V(T1), V(T2)] across capacitor C20 to the voltage V(T1) at the non-inverting input terminal, and the output voltage Vout is a voltage that is the result of externally dividing (extrapolating) the voltages V(T1) and V(T2) at the 1:2 ratio.

Thus, this operational amplifier circuit is one that amplifies and outputs a voltage obtained by externally dividing (extrapolating) the voltages V(T1) and V(T2) at the 1:2 ratio when the two voltages V(T1) and V(T2) have been input serially to the terminal T0 in successive fashion.

Figure 9:
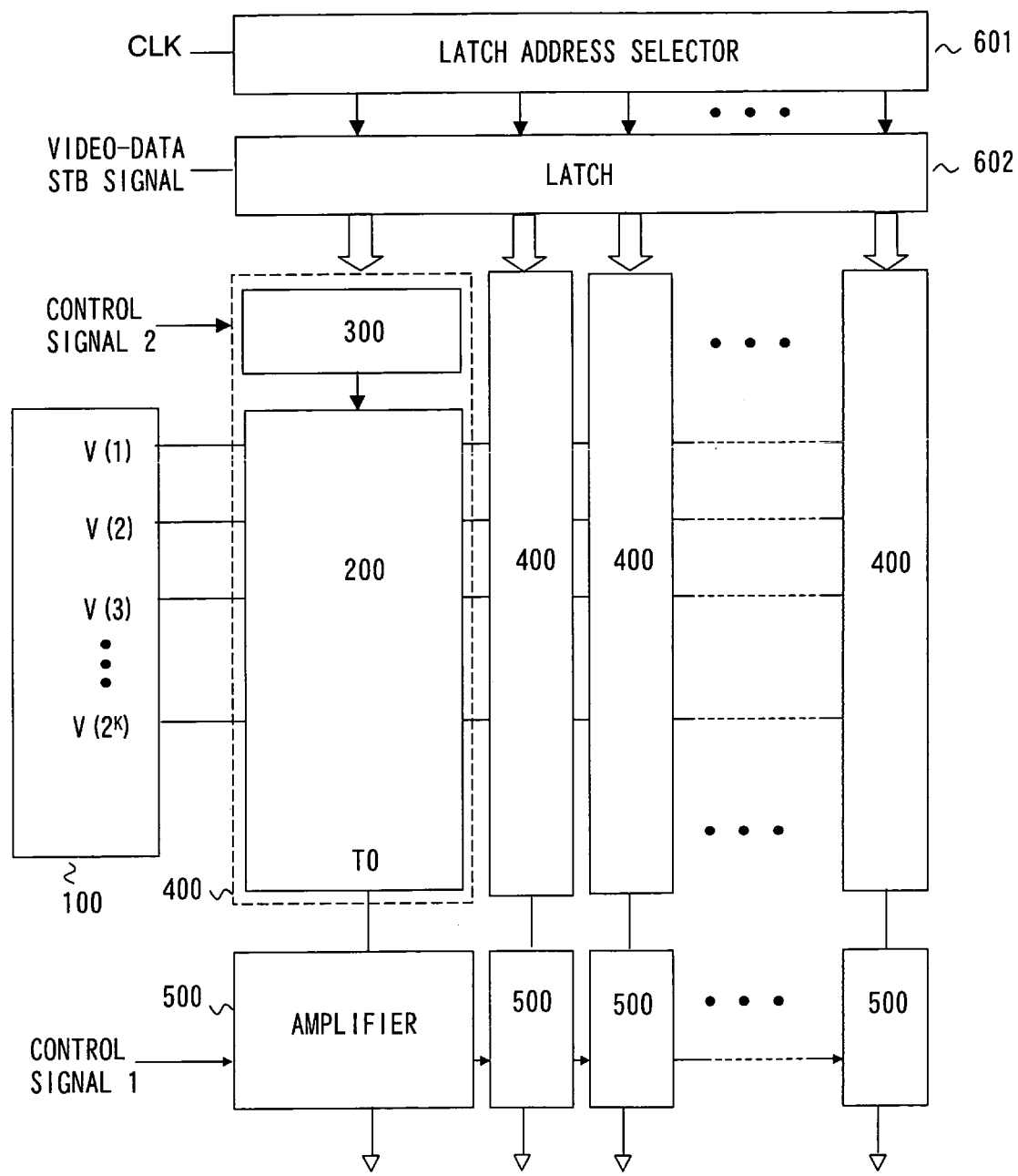
FIG. 9 is a diagram illustrating the configuration of a multiple-output DAC embodying a DAC according to the present invention.

FIG. 9 is a diagram illustrating the configuration of a multiple-output DAC according to an embodiment of the present invention. FIG. 9 is an arrangement obtained by replacing the grayscale voltage generating circuit 986 and buffer circuit 988 of FIG. 19 with the reference voltage generating circuit 100 and operational amplifying circuit 500 of FIG. 1, and replacing the decoder 987 of FIG. 19 with the data input control circuit 300 and decoder 200 of FIG. 1. It should be noted that the data input control circuit 300 and decoder 200 are indicated collectively by circuit 400 in FIG. 9. Further, a latch address selector 601 and a latch 602 can employ implementations equivalent to those of 981, 982 in FIG. 19.

The reference voltage generating circuit 100 generates and outputs $2^K$ reference voltages with respect to $4^K$ output levels and is shared by the multiple-output DACs.

If the $2^K$ reference voltages are set according to Equation (2), the $4^K$ output levels of each of the DACs are linear. The circuits 400 in FIG. 9 can employ the arrangement shown in FIG. 4.

It should be noted that if the arrangement of FIG. 5 is used for the circuits 400, it is necessary to modify the latch 602 in such a manner that data is supplied to the circuit 400 serially for each of the even-numbered and odd-numbered bit groups.

The implementation of any of FIGS. 6A, 7A and 8A can be used as the operational amplifying circuit 500. In such case the control signals 1 and 2 would be controlled in such a manner that the data of the even-numbered bit group is output from the data input control circuit 300 to the decoder 200 in time period t1 of FIGS. 6A, 7A and 8A, the reference voltage selected based thereon is input to the operational amplifying circuit 500 as voltage V(T1), the data of the odd-numbered bit group is output from the data input control circuit 300 to the decoder 200 in time period t2 and the reference voltage selected based thereon is input to the operational amplifying circuit 500 as voltage V (T2).

Each DAC in FIG. 9 may be constructed as a plurality of blocks in which $4^K$-number of output levels serve as one block. In such case the reference voltage generating circuit 100 also would be so adapted that $2^K$-number of reference voltages are provided in the equivalent number of blocks, and the circuits 400 also would be constructed in accordance with the number of blocks.

The effect in terms of reducing the number of elements in each block and in diminishing area is as described above.

Figure 19:
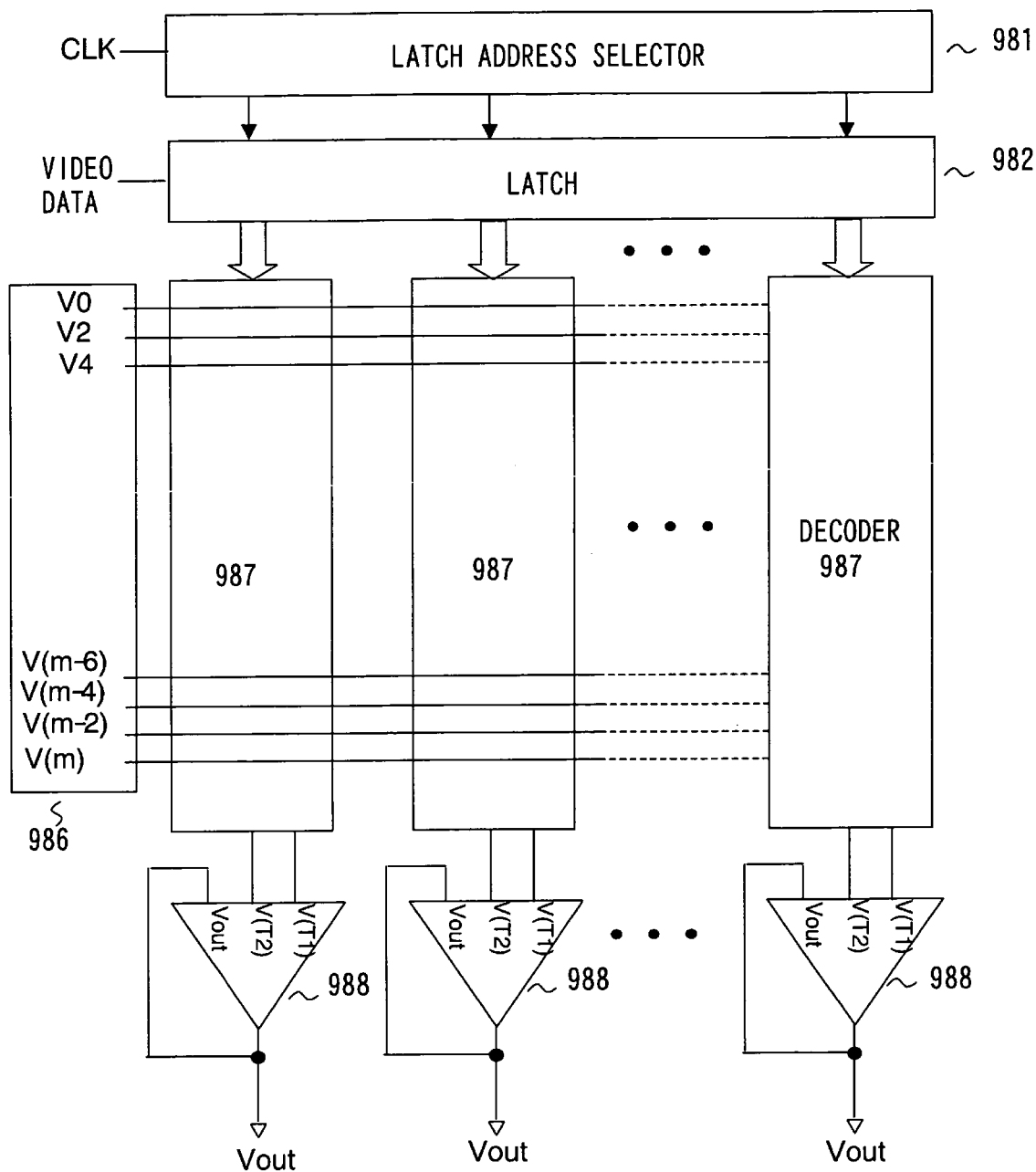
FIG. 19 is a diagram the structure of a data driver proposed in Patent Document 1.
Figure 20:
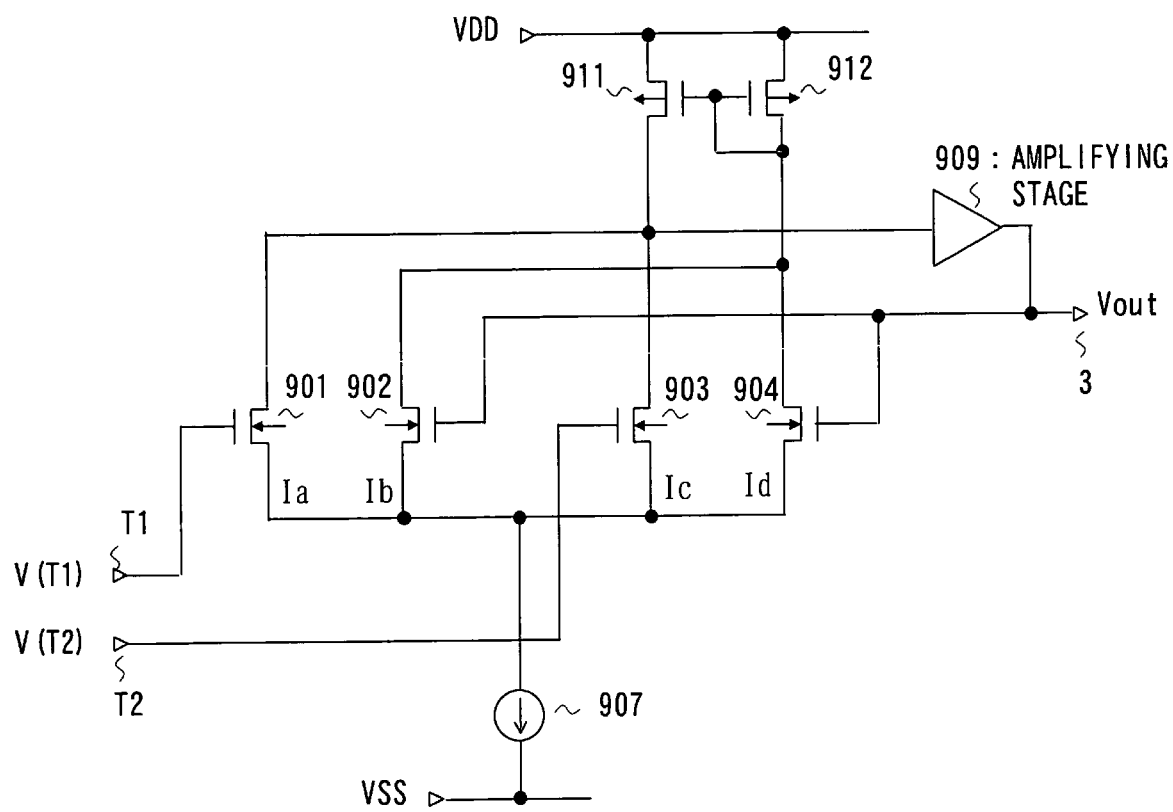
FIG. 20 is a diagram illustrating the structure (as inferred by the inventor) of a differential amplifier described in Patent Document 1.

As mentioned above, the arrangement of FIG. 9 is such that the number of reference voltages is reduced in comparison with FIG. 19, the number of decoder elements is reduced by a wide margin and area is capable of being reduced. A low-cost data driver LSI chip can be realized by the reduction in chip size, and this contributes greatly to a reduction in the cost of a display device. Further, in a display device in which the display portion, gate driver and data driver, etc., are formed integrally using a thin-film semiconductor such as polysilicon (amorphous polysilicon), a reduction in frame width can be achieved by reducing the area of the data driver.

Further, the reference voltage generating circuit 100, decoder 200 and operational amplifying circuit 500 in FIGS. 1 to 5 and FIG. 9 are such that the power-supply voltage is decided by the voltage generated by the reference voltage generating circuit 100.

On the other hand, the power-supply voltage can be set separately for data input control circuit 300 (300A, 300B), latch address selector 601 and latch 602, and for the purpose of reducing size and conserving power, this can be set to a power-supply voltage lower than the power-supply voltage of the reference voltage generating circuit 100, decoder 200 and operational amplifying circuit 500. In such case a level shifting circuit would be provided. If such an arrangement is applied to the present invention, the level shifting circuit would preferably be provided between the data input control circuit 300 (300A, 300B) and decoder 200 in FIGS. 1 to 5.

Figure 10:
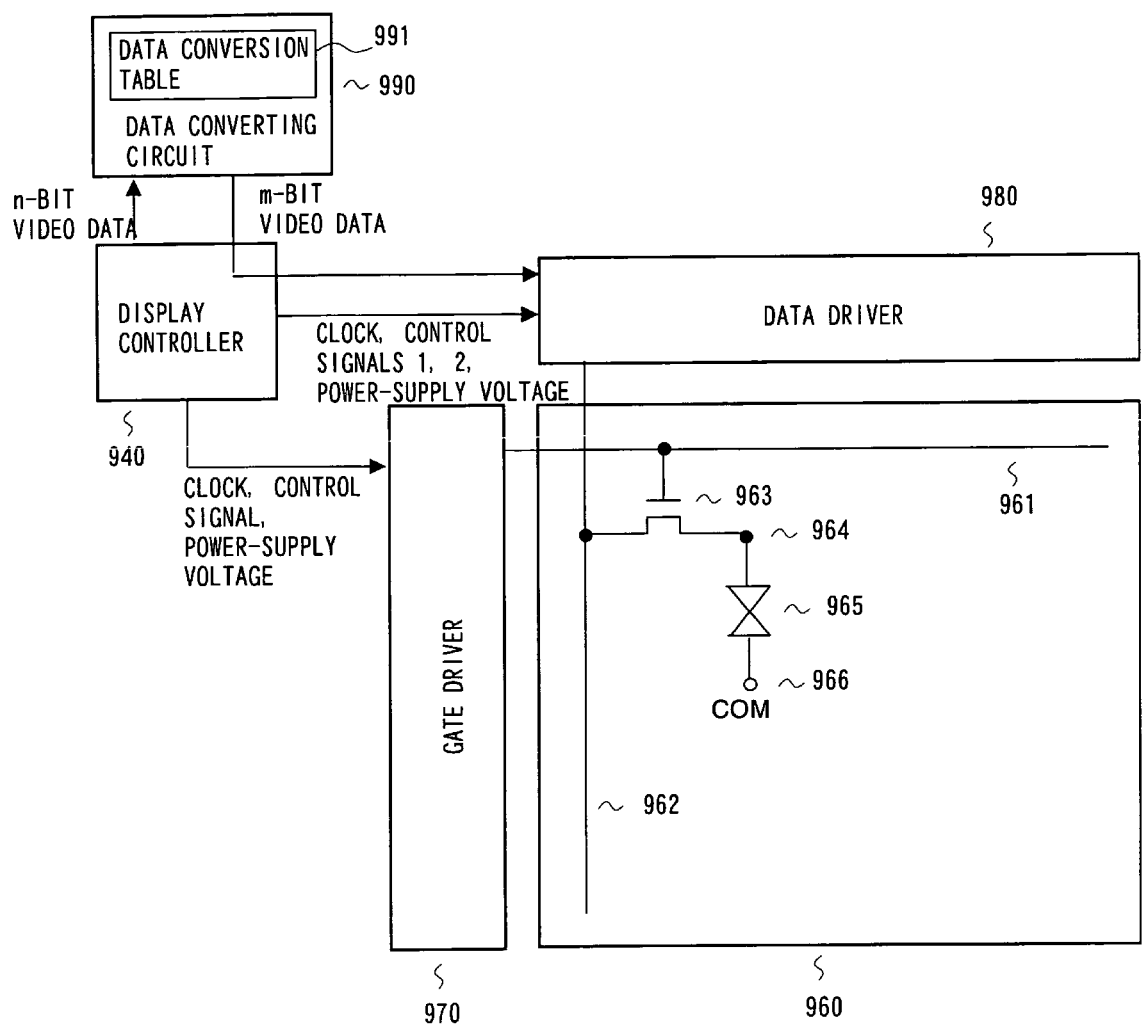
FIG. 10 is a diagram illustrating an embodiment of a display device according to the present invention.

FIG. 10 is a diagram illustrating the configuration of a display device embodying the present invention. The data driver 980 is the data driver comprising the arrangement of FIG. 9. Here a linear output is obtained in response to an m ($=2^K$)-bit data input. In a case where a linear-output data driver is used, grayscale voltages that conform to the gamma characteristic of the display device [liquid crystal or organic electroluminescent (EL) element] can be output by assigning grayscale voltages that conform to a gamma characteristic of the display-device from among a multiplicity of linear output levels. The data driver therefore has a number of linear levels that is greater than the number of display tones.

In FIG. 10, the device includes a data conversion table 991 for converting n-bit data that corresponds to display tones to m−(m>n) bit data that corresponds to linear levels, and a data converting circuit 990 for performing a data conversion based upon the data conversion table 991.

The data conversion table 991 ideally is one made to conform to the gamma curve of a liquid crystal or to the characteristics of each of R, G, B of liquid crystal or organic EL device. It will suffice if the data conversion table 991 and data converting circuit 990 are such that m(=2K)-bit data is input to the data driver 980, and it is simple to provide these in linkage with the display controller 940, as illustrated in FIG. 10.

It goes without saying that the present invention is not limited to a liquid crystal display device and is applicable to an active-matrix display device in which the luminance of pixels is controlled by driving data lines with level voltages. One example is an organic EL display device that has come into practical use in recent years.

Figure 17:
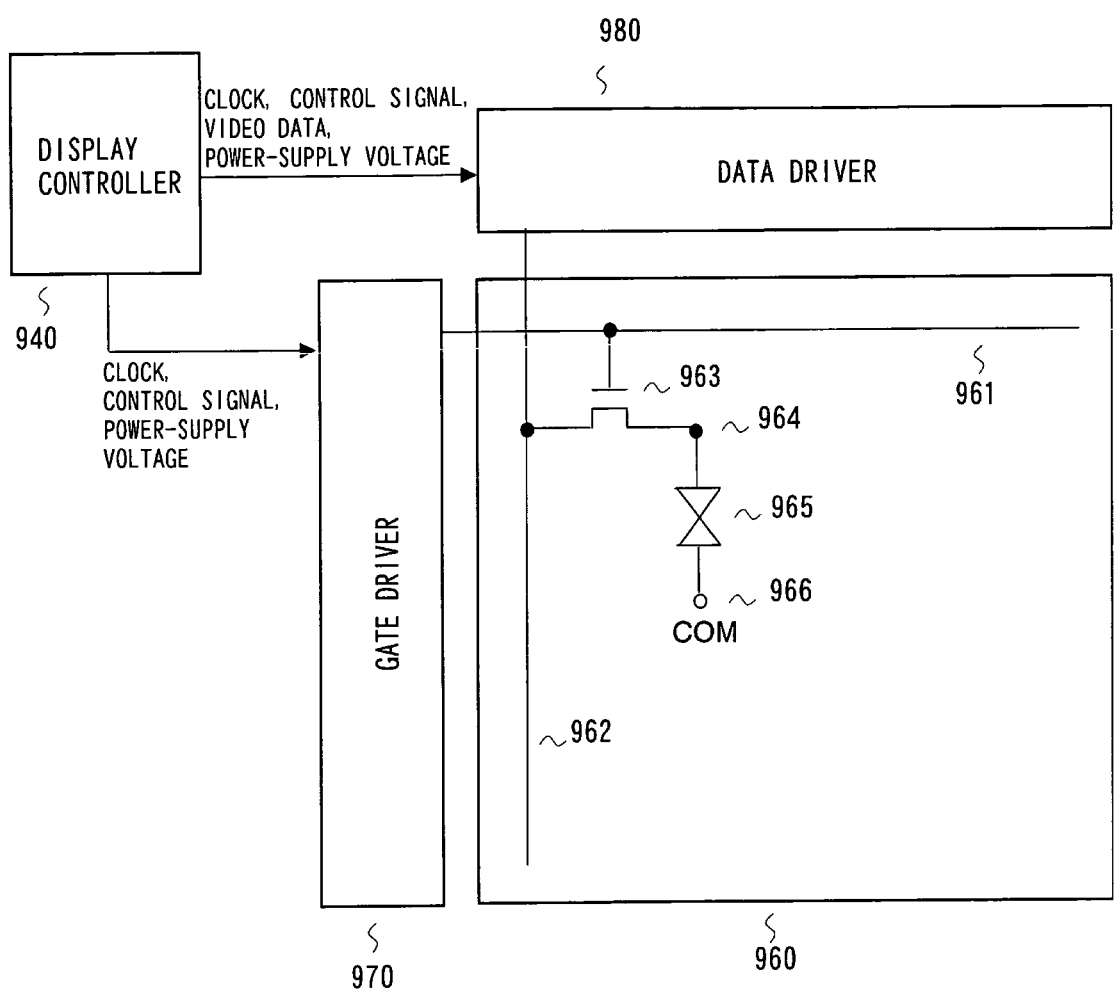
FIG. 17 is a diagram illustrating the typical structure of an active-matrix liquid crystal display device.
Figure 18:
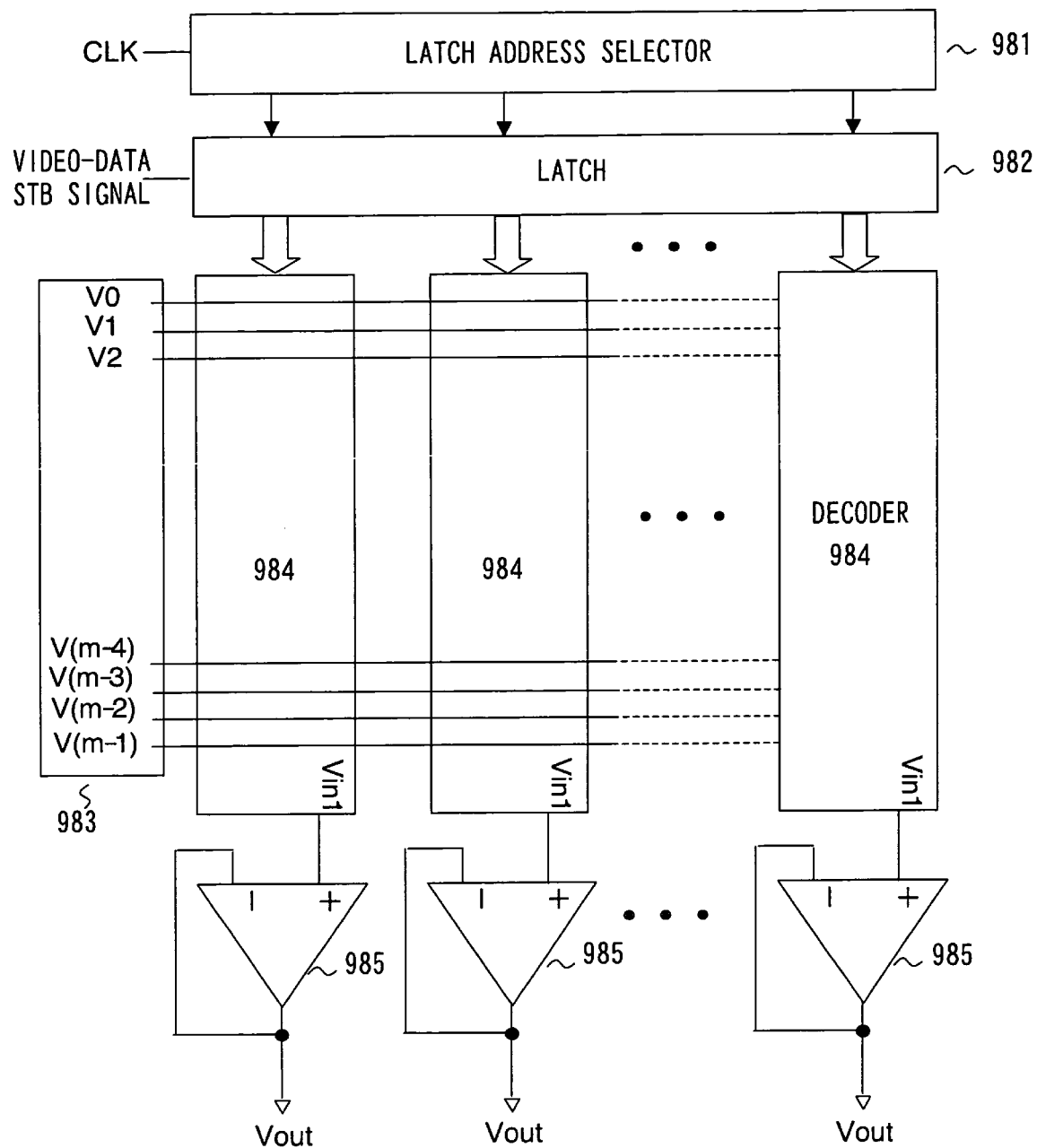
FIG. 18 is a diagram illustrating an example of the general structure of a data driver 980 in FIG. 17.
Figure 21:
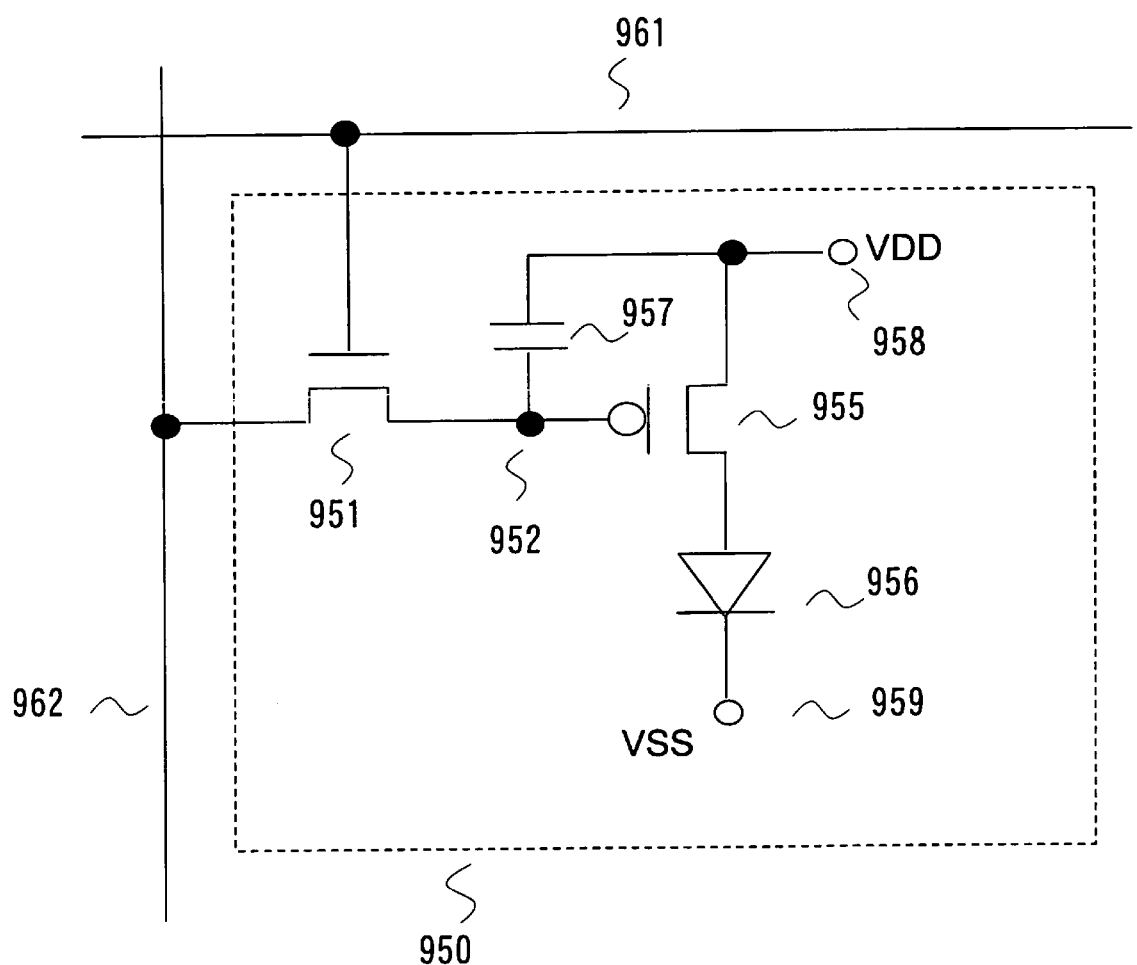
FIG. 21 is a diagram for describing an electroluminescent element.

In FIG. 21, the principal components of a pixel portion 950 (one pixel) in an EL display device are illustrated schematically by an equivalent circuit. If the pixel portion 950 of FIG. 21 is applied to the pixel portion (the pixel comprising the TFT 963, pixel electrode 964 and opposing substrate electrode 966 at the intersection of scan line 961 and data line 962) in FIG. 17, then FIG. 17 will take on the form of an active-matrix EL display device. The arrangement of the embodiment described above is provided as the data driver of FIG. 17.

As shown in FIG. 21, the pixel portion 950 comprises TFTs (thin-film transistors) 951 and 955, an electrode terminal 952, an EL element (light-emitting diode) 956, a capacitor 957 and power-supply terminals 958 and 959. The display section of this organic EL display device comprises a structure obtained by building up electrodes, TFTs and EL elements, which consist of a thin film of organic material, on a substrate. The TFT 951 connects the data line 962 and electrode terminal 952 as a switching element, and the control terminal of this TFT is connected to the scan line 961. The TFT 955 and EL element 956 are connected serially between two power-supply terminals 958, 959, and the electrode terminal 952 is connected to the control terminal of the TFT 955. Further, one end of the voltage holding capacitor 957 is connected to the electrode terminal 952, and the other end of the capacitor 957 is connected to a terminal that is capable of holding fixed a current that flows into the TFT 955. That is, this end of the capacitor is connected to the power-supply terminal or to the source terminal of the TFT 955.

In terms of the display mechanism, the TFT 951 having the switching function is turned ON and OFF by the scan signal. When the TFT 951 is turned ON, a grayscale voltage signal corresponding to a video data signal is applied to the electrode terminal 952 and to the control terminal of the TFT 955. The TFT 955 effects the conversion to a current that conforms to the grayscale voltage signal and controls the light-emission luminance of the EL element 956 having a luminance characteristic that conforms to the flowing current. The holding capacitor 957 holds the potential of the electrode terminal 952 even after the TFT 951 turns OFF, and the light-emission luminance of the EL element 956 is maintained for a fixed period of time, whereby an image is displayed.

FIG. 21 illustrates an example in which the TFTs 951 and 955 are p- and n-channel transistors, respectively. However, these can also be transistors of identical polarity. Further, a switching TFT may be added to the TFTs 951 and 955. Although various implementations have been proposed in order to further improve performance, the present invention does not go beyond a description solely of basic structure. Furthermore, the arrangement of FIG. 10 may of course be implemented by an EL display device.

As mentioned above, the digital-to-analog converter circuit of the present invention can also be used in the data driver of an organic EL display device and effects similar to those of a liquid crystal display device can be obtained.

Though the present invention has been described in accordance with the foregoing embodiments, the invention is not limited to this embodiment and it goes without saying that the invention covers various modifications and changes that would be obvious to those skilled in the art within the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A digital-to-analog converting circuit comprising:
   a decoder, receiving a digital data signal and a plurality (m) of reference voltages having voltage values that differ from one another, for selecting first and second voltages, inclusive of voltages that are identical, from among the m reference voltages to output the selected first and second voltages successively to a single terminal, using the digital data signal as a selection signal; and
   and an amplifier circuit, receiving the first and second voltages supplied to the single terminal from said decoder successively, for outputting from an output terminal thereof an output voltage obtained by externally extrapolating the first and second voltages at a predetermined prescribed external ratio;
   wherein a maximum of $m^2$ voltage levels that differ from one another can be output from the output terminal in accordance with value of the digital data signal.

2. A data driver for driving data lines based upon a digital data signal input thereto, said data driver having the digital-to-analog converting circuit set forth in claim 1.

3. A display device comprising:
   a plurality of data lines extending in parallel with one another along a first direction;
   a plurality of scan lines extending in parallel with one another in a direction perpendicular to the first direction;
   a plurality of pixel electrodes arranged in matrix form at intersections of said plurality of data lines and said plurality of scan lines;
   a plurality of transistors corresponding to respective ones of said plurality of pixel electrodes, each transistor having a drain and a source one of which is connected to the corresponding pixel electrode and the other of which is connected to a corresponding data line, and a gate connected to a corresponding scan line;
   a gate driver for supplying scan signals to respective ones of said plurality of scan lines; and a data driver for supplying grayscale signals, which correspond to input data, to respective ones of said plurality of data lines;
   said data driver comprising the data driver set forth in claim 2.

4. A display device comprising:
   a data driver, which includes the digital-to-analog converting circuit set forth in claim 1; and
   a display panel;
   data lines of said display panel being driven based upon an output signal from said data driver.

5. The digital-to-analog converting circuit according to claim 1, wherein:
   V(T1) denotes the first voltage;
   V(T2) denotes the second voltage;
   Vout denotes the output voltage; and
   a:b denotes the predetermined prescribed external ratio,
   wherein the first and second voltages are externally extrapolated to satisfy the following Formula (1)

Vout+aV(T1)−bV(T2).  Formula (1)

6. The digital-to-analog converting circuit according to claim 1,
   wherein said first and second voltages are supplied successively via said single terminal from said decoder to said amplifier circuit during one data interval.

7. A display device comprising:
   a plurality of data lines extending in parallel with one another along a first direction;
   a plurality of scan lines extending in parallel with one another in a direction perpendicular to the first direction;
   a plurality of pixel electrodes arranged in matrix form at intersections of said plurality of data lines and said plurality of scan lines;
   a plurality of transistors corresponding to respective ones of said plurality of pixel electrodes, each transistor havin a drain and a source one of which is connected to the corresponding pixel electrode and the other of which is connected to a corresponding data line, and a gate connected to a corresponding scan line;
   a gate driver for supplying scan signals to respective ones of said plurality of scan lines;
   a data driver for supplying grayscale signals, which correspond to input data, to respective ones of said plurality of data lines,
   said data driver comprising a digital-to-analog converting circuit;
   a data conversion table for making n-bit video data correspond to m-bit (n>m) video data for each of colors R, G and B; and
   a data converting circuit, receiving the n-bit video data signal, for converting the n-bit video data signal to the m-bit video data signal by referring to said data conversion table, and outputting the m-bit video data signal to said data driver.

8. The display device according to claim 7, wherein the digital-to-analog converting circuit comprises:
   a decoder, receiving a digital data signal and a plurality (m) of reference voltages having voltage values that differ from one another, for selecting first and second voltages, inclusive of voltages that are identical, from among the in reference voltages to output the selected first and second voltages successively to a single terminal, using the digital data signal as a selection signal; and
   and an amplifier circuit, receiving the first and second voltages supplied to the single terminal from said decoder successively, for outputting from an output terminal thereof an output voltage obtained by externally dividing the first and second voltages at a predetermined prescribed external ratio;
   wherein a maximum of $m^2$ voltage levels that differ from one another can be output from the output terminal in accordance with value of the digital data signal.

9. A digital-to-analog converting circuit comprising:
   a reference voltage generating circuit for outputting a plurality of reference voltages having voltage values that differ from one another;
   a data input control circuit for exercising control responsive to a control signal so as to output either one of even-numbered bits or odd-numbered bits and then the other of the even-numbered bits or odd-numbered bits from a multiple-bit digital data signal supplied thereto;
   a decoder for successively selecting first and second voltages, inclusive of voltages that are identical, from among the plurality of reference voltages, which are output from said reference voltage generating circuit, in accordance with an output signal from said data input control circuit, and outputting the selected first and second voltages successively to a single terminal; and an amplifier circuit, receiving the first and second voltages supplied to the single terminal from said decoder successively, for outputting from an output terminal thereof an output voltage obtained by externally dividing the first and second voltages at a predetermined prescribed external ratio.

10. The digital-to-analog converting circuit according to claim 9, wherein said data input control circuit inverts either the even-numbered bits or the odd-numbered bits to output the resulting bits.

11. The digital-to-analog converting circuit according to claim 9, wherein said data input control circuit includes:
   a switch, inserted between a terminal to which the digital data signal is input and a terminal from which an output signal is output, for being turned ON and OFF based upon the control signal; and
   an inverting circuit for inverting either the even-numbered bits or the odd-numbered bits;
   said data input control circuit supplying said decoder successively with either of the even-numbered bits or odd-numbered bits as an un-inverted signal and the other of the even-numbered bits or odd-numbered bits as an inverted signal in accordance with the control signal.

12. The digital-to-analog converting circuit according to claim 9, wherein even-numbered bits and odd-numbered bits of the multiple-bit digital data signal are input to said data input control circuit in parallel.

13. The digital-to-analog converting circuit according to claim 9, wherein either one of even-numbered bits or odd-numbered bits of the multiple-bit digital data signal are input to said data input control circuit followed by input of the other of the even-numbered bits and odd-numbered bits.

14. The digital-to-analog converting circuit according to claim 9, wherein said decoder includes at least two switches, with regard to one output signal that is output from said data input control circuit said two switches, receiving un-inverted and inverted signals of the output signal at control terminal thereof, respectively, for being controlled on and off;
   said two switches having first ends connected directly or via other switches to mutually different reference voltage supply terminals, and second ends connected directly or via other switches to the single terminal.

15. The digital-to-analog converting circuit according to claim 9, wherein said decoder includes a switch group comprising a plurality of switches connected between respective ones of voltage supply terminals of said reference voltage generating circuit that outputs the plurality of reference voltages and the single terminal;
   each of said plurality of switches being shared by the corresponding even-numbered bit and odd-numbered bit from said data input control circuit, for being on/off controlled based upon the even-numbered bit and odd-numbered.

16. The digital-to-analog converting circuit according to claim 9, wherein said amplifier circuit includes a capacitance element and switch;
   said amplifier circuit operating on the first and second voltages, supplied successively from the single terminal, by changing over connection of the capacitance element and switch, and outputting the resultant voltage.

17. The digital-to-analog converting circuit according to claim 9, wherein said amplifier circuit includes:

a plurality of differential pairs, each having an input pair and an output pair, said plurality of differential pairs being supplied with currents from current sources associated therewith, respectively;

a load circuit connected to the output pairs of said plurality of differential pairs;

an amplifying stage having an input end connected to at least one connection node of a connection node pair of the load circuit and the output pairs of said plurality of differential pairs, and an output end connected to the output terminal;

a switch having a first end connected to the single terminal; and a capacitor connected between a second end of said switch and a reference voltage terminal;

first inputs of input pairs of said plurality of differential pairs being connected in common to the second end of said switch; and second inputs of the input pairs of a prescribed number of differential pairs among said plurality of differential pairs being connected to the single terminal, while second inputs of the input pairs of the remaining differential pairs being connected to the output terminal.

18. The digital-to-analog converting circuit according to claim 9, wherein said amplifier circuit includes:

first and second differential pairs, each having an input pair and an output pair, said first and second differential pairs being supplied with currents from current sources associated therewith, respectively;

a load circuit connected to the output pairs of said first and second differential pairs;

an amplifying stage having an input end connected to at least one connection node of a connection node pair of the load circuit and the output pairs of said first and second of differential pairs, and an output end connected to the output terminal;

a first switch having a first end connected to the single terminal;

a capacitor connected between a second end of said first switch and a reference voltage terminal;

first inputs of the input pairs of said first and second differential pairs being connected in common to the second end of said first switch; and second and third switches connected between a second input of the input pair of said first differential pair and the output terminal and the single terminal, respectively;

a second input of the input pair of said second differential pair being connected to the output terminal.

19. The digital-to-analog converting circuit according to claim 9, wherein said amplifier circuit includes:
   a differential amplifier;
   a first switch having a first end connected to the single terminal and a second end connected to a non-inverting input terminal of said differential amplifier;
   a second switch having a first end connected to the single terminal;
   a third switch connected between an inverting input terminal of 10 said differential amplifier and the output terminal;
   a first capacitor connected between a second end of said second switch and an output terminal of said differential amplifier;
   a fourth switch connected between the second end of said second switch and the inverting input terminal of said differential amplifier; and a second capacitor connected between the second end of said first switch and a reference voltage terminal.

20. The digital-to-analog converting circuit according to claim 9, wherein the number of voltage levels that are output by said amplifier circuit is the square of the plurality of reference voltages.

21. The digital-to-analog converting circuit according to claim 9, wherein said decoder receives as inputs first to mth ($m=2^K$, where K is a prescribed positive integer) reference voltages having voltage values that differ from one another for selecting and outputting from the single terminal any one pair among $4^K$ combinations of voltage pairs relating to the first to $2^K$th reference voltages; wherein a maximum of $4^K$ different voltage levels can be output from the output terminal.

22. The digital-to-analog converting circuit according to claim 9, wherein the external ratio is 1:2 and the sum of the output voltage and the second voltage is twice the first voltage;

said decoder receives as inputs first to mth ($m=2^K$ where K is a prescribed positive integer) reference voltages having voltage values that differ from one another; and among first to $4^K$th linear voltage levels, first to $2^K$th reference voltages each take on a
$[1+\Sigma^{K-1 X=0}(\epsilon_X \cdot 4^X)]$th level
(where $\epsilon_X$ takes on values of 1 and 2), and voltages of a total of $4^K$ levels from a first level to a $4^K$th level that differ from one another are output from the output terminal.

23. A data driver for driving data lines based upon a digital data signal input thereto, said data driver having the digital-to-analog converting circuit set forth in claim 9.

* * * * *